(12) United States Patent
Lee et al.

(10) Patent No.: US 9,384,893 B2
(45) Date of Patent: Jul. 5, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon, Gyunggi-do (KR)

(72) Inventors: Jong Ho Lee, Gyunggi-do (KR); Doo Young Kim, Gyunggi-do (KR); Myung Jun Park, Gyunggi-do (KR); Jae Yeol Choi, Gyunggi-do (KR); Young Ghyu Ahn, Gyunggi-do (KR); Sang Huk Kim, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 219 days.

(21) Appl. No.: 14/086,091

(22) Filed: Nov. 21, 2013

(65) Prior Publication Data

US 2015/0041193 A1 Feb. 12, 2015

(30) Foreign Application Priority Data

Aug. 8, 2013 (KR) .................. 10-2013-0094259

(51) Int. Cl.
*H01G 4/012* (2006.01)
*H01G 4/12* (2006.01)
*H01G 4/30* (2006.01)
*H01G 4/232* (2006.01)
(Continued)

(52) U.S. Cl.
CPC .................. *H01G 4/12* (2013.01); *H01G 4/012* (2013.01); *H01G 4/232* (2013.01); *H01G 4/30* (2013.01); *H05K 3/3436* (2013.01); *H05K 1/181* (2013.01); *H05K 2201/10015* (2013.01); *H05K 2201/10636* (2013.01); *H05K 2201/2045* (2013.01); *H05K 2203/0465* (2013.01); *Y02P 70/611* (2015.11); *Y02P 70/613* (2015.11)

(58) Field of Classification Search
CPC ..... H01G 4/12; H01G 4/1204; H01G 4/1218; H01G 4/1227; H01G 4/1236; H01G 4/224
USPC .................................................. 361/271–330
See application file for complete search history.

(56) References Cited

U.S. PATENT DOCUMENTS

| 4,785,990 | A  | * | 11/1988 | Nakahara et al. | ............ | 228/170 |
| 6,243,252 | B1 | * | 6/2001  | Kuroiwa et al.  | ............ | 361/303 |
| 6,373,673 | B1 | * | 4/2002  | Anthony         | .............. | 361/117 |

(Continued)

FOREIGN PATENT DOCUMENTS

JP          10-289837 A      10/1998

*Primary Examiner* — Jeremy C Norris
*Assistant Examiner* — Muhammed Azam
(74) *Attorney, Agent, or Firm* — McDermott Will & Emery LLP

(57) ABSTRACT

A multilayer ceramic capacitor includes: a ceramic body; an active layer disposed in the ceramic body and including first internal electrodes each having a first lead part exposed to at least one of the first and second side surfaces, and second internal electrodes each having a second lead part exposed to the at least one of the first and second side surfaces, thereby forming capacitance; an upper cover layer formed on an upper portion of the active layer in the thickness direction; a lower cover layer formed on a lower portion of the active layer in the thickness direction and having a thickness greater than that of the upper cover layer; a first external; and a second external electrode.

27 Claims, 21 Drawing Sheets

(51) Int. Cl.
  *H05K 3/34*  (2006.01)
  *H05K 1/18*  (2006.01)

(56) References Cited

U.S. PATENT DOCUMENTS

| | | | | |
|---|---|---|---|---|
| 6,912,115 B2* | 6/2005 | Kobayashi | ............... | H01G 4/30 361/303 |
| 6,958,899 B2* | 10/2005 | Togashi | ................. | H01G 2/065 361/303 |
| 7,123,467 B2* | 10/2006 | Greier | ...................... | H01G 2/12 361/306.1 |
| 7,399,643 B2* | 7/2008 | Moon | ............... | B01L 3/502761 436/501 |
| 7,446,996 B2* | 11/2008 | Togashi | ........................ | 361/303 |
| 7,843,679 B2* | 11/2010 | Togashi | ........................ | 361/303 |
| 2001/0033219 A1* | 10/2001 | Iha | ........................ | G03F 7/0047 336/90 |
| 2004/0266087 A1* | 12/2004 | Greier et al. | ................... | 438/202 |
| 2006/0158827 A1* | 7/2006 | Lee | ........................... | H01G 4/30 361/311 |
| 2007/0096254 A1* | 5/2007 | Ritter et al. | .................... | 257/532 |
| 2010/0039749 A1* | 2/2010 | Ritter | .................... | H01G 4/005 361/301.4 |
| 2011/0141652 A1* | 6/2011 | Chang | ................... | H01G 4/012 361/272 |
| 2011/0191655 A1* | 8/2011 | Schreck | .............. | G06F 11/1056 714/773 |
| 2012/0018844 A1* | 1/2012 | Hafezi | ........................ | 257/532 |
| 2013/0050899 A1* | 2/2013 | Kim et al. | .................. | 361/321.2 |
| 2013/0294009 A1* | 11/2013 | Takeuchi et al. | .............. | 361/305 |

\* cited by examiner

B-B'

MULTILAYER CERAMIC CAPACITOR AND BOARD HAVING THE SAME MOUNTED THEREON

CROSS-REFERENCE TO RELATED APPLICATION

This application claims the benefit of Korean Patent Application No. 10-2013-0094259 filed on Aug. 8, 2013, with the Korean Intellectual Property Office, the disclosure of which is incorporated herein by reference.

BACKGROUND

The present disclosure relates to a multilayer ceramic capacitor and a board having the same mounted thereon.

Generally, electronic components using a ceramic material, such as a capacitor, an inductor, a piezoelectric element, a varistor, a thermistor, or the like, include a ceramic body made of a ceramic material, internal electrodes formed in the ceramic body, and external electrodes mounted on external surfaces of the ceramic body so as to be connected to the internal electrodes.

Among ceramic electronic components, a multilayer ceramic capacitor includes a plurality of stacked dielectric layers, internal electrodes opposed to each other, having the dielectric layer interposed therebetween, and external electrodes electrically connected to the internal electrodes.

Multilayer ceramic capacitors have been widely used as components in mobile communications devices such as laptop computers, personal digital assistants (PDAs), mobile phones, and the like, due to advantages thereof such as a small size, high capacitance, ease of mounting, or the like.

Recently, as electronic products have been miniaturized and multi-functionalized, chip components have also tended to be miniaturized and multi-functionalized. As a result, there is a need to miniaturize multilayer ceramic capacitors and increase the capacity thereof.

In addition, a multilayer ceramic capacitor has been usefully used as a bypass capacitor disposed in a power supply circuit of large scale integration (LSI). The multilayer ceramic capacitor serving as the bypass capacitor needs to effectively remove high frequency noise. This demand is further increasing in accordance with the trend in which electronic devices increasingly operate in a high frequency band. The multilayer ceramic capacitor used as the bypass capacitor may be electrically connected to amounting pad on a circuit board through soldering, and the mounting pad may be connected to other external circuits through wiring patterns or conductive vias in the circuit board.

RELATED ART DOCUMENT (Patent Document 1) Japanese Patent Laid-Open Publication No. 1998-289837

SUMMARY

An aspect of the present disclosure may provide a multilayer ceramic capacitor and a board having the same mounted thereon.

According to an aspect of the present disclosure, a multilayer ceramic capacitor may include: a ceramic body including dielectric layers and having first and second main surfaces facing each other in a thickness direction, first and second end surfaces facing each other in a length direction, and first and second side surfaces facing each other in a width direction; an active layer disposed in the ceramic body and including first internal electrodes each having a first lead part exposed to at least one of the first and second side surfaces, and second internal electrodes opposed to the first internal electrodes, with the dielectric layers interposed therebetween, and each having a second lead part exposed to the at least one of the first and second side surfaces, thereby forming capacitance; an upper cover layer formed on an upper portion of the active layer in the thickness direction; a lower cover layer formed on a lower portion of the active layer in the thickness direction and having a thickness greater than that of the upper cover layer; a first external electrode connected to the first internal electrodes and extended from the side to which the first lead part is exposed to at least one of the first and second main surfaces; a second external electrode connected to the second internal electrodes and extended from the side to which the second lead part is exposed to at least one of the first and second main surfaces; and insulating layers covering the first and second external electrodes formed on the first and second side surfaces.

Regions of the first and second lead parts exposed to the at least one of the first and second side surfaces may be overlapped with each other.

Regions of the first and second lead parts exposed to the at least one of the first and second side surfaces may not be overlapped with each other.

Regions of the first and second lead parts exposed to the at least one of the first and second side surfaces may have widths smaller than those of the first and second external electrodes formed on the first and second side surfaces.

The first and second lead parts may be exposed to the first side surface of the ceramic body.

The first and second lead parts may be exposed to the first and second side surfaces of the ceramic body, respectively.

The first lead part may be exposed to the first side surface, and the second lead part may be exposed to the second side surface.

The first and second external electrodes may be extended from the first side surface to the at least one of the first and second main surfaces.

The first and second external electrodes may be extended from the first side surface to the first and second main surfaces.

The first and second external electrodes may be extended from the first side surface to one of the first and second main surfaces, and the second side surface.

The first and second external electrodes may be extended from the first side surface to the first and second main surfaces and the second side surface.

The first and second external electrodes may be spaced apart from the first and second end surfaces by a predetermined interval.

The first external electrode may be extended from the first side surface to the first main surface, and the second external electrode may be extended from the second side surface to the first main surface.

The insulating layers may cover the first and second external electrodes formed on the first and second side surfaces and the first and second side surfaces of the ceramic body.

The insulating layers may cover the first and second external electrodes formed on the first and second side surfaces and the first and second side surfaces and the first and second end surfaces of the ceramic body.

The insulating layers may cover regions of the first and second external electrodes formed on the first and second side surfaces, from a mounting surface to a predetermined height.

The insulating layers may be spaced apart from a mounting surface of the ceramic body by a predetermined interval.

The insulating layers may be formed of an organic resin, a ceramic, an inorganic filler, a glass, or a mixture thereof.

The upper or lower cover layer may include an identifying part for identifying upper and lower portions of the ceramic body.

The identifying part may include a dielectric layer in which at least one metal selected from a group consisting of nickel (Ni), manganese (Mn), chromium (Cr), and Vanadium (V) is added.

The identifying part may be a mark generated by laser marking.

The first and second internal electrodes may be disposed horizontally with respect to a mounting surface of the ceramic body.

When an average thickness of the dielectric layers is defined as td, 0.1 µm≤td≤2.0 µm may be satisfied.

Thicknesses of the first and second internal electrodes may be 1.5 µm or less.

According to another aspect of the present disclosure, a board having a multilayer ceramic capacitor mounted thereon may include: a printed circuit board having first and second electrode pads disposed thereon; and a multilayer ceramic capacitor mounted on the printed circuit board, wherein the multilayer ceramic capacitor may include: a ceramic body including dielectric layers and having first and second main surfaces facing each other in a thickness direction, first and second end surfaces facing each other in a length direction, and first and second side surfaces facing each other in a width direction; an active layer disposed in the ceramic body and including first internal electrodes each having a first lead part exposed to at least one of the first and second side surfaces and second internal electrodes opposed to the first internal electrodes, with the dielectric layers interposed therebetween, and each having a second lead part exposed to the at least one of the first and second side surfaces, thereby forming capacitance; an upper cover layer formed on an upper portion of the active layer in the thickness direction; a lower cover layer formed on a lower portion of the active layer in the thickness direction and having a thickness greater than that of the upper cover layer; a first external electrode connected to the first internal electrodes and extended from the side to which the first lead part is exposed to at least one of the first and second main surfaces; a second external electrode connected to the second internal electrodes and extended from the side to which the second lead part is exposed to the at least one of the first and second main surfaces; and insulating layers covering the first and second external electrodes formed on the first and second side surfaces

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
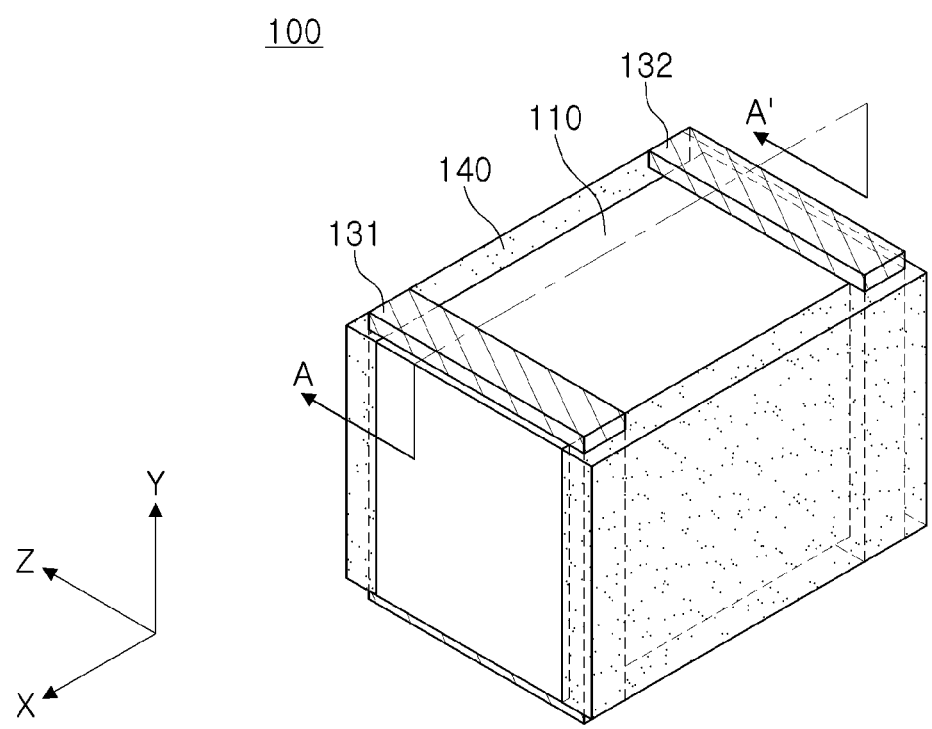
FIG. 1 is a perspective view schematically showing a multilayer ceramic capacitor according to an exemplary embodiment of the present disclosure.

Exemplary embodiments of the present disclosure may be modified in many different forms and the scope of the disclosure should not be limited to the embodiments set forth herein. Rather, these embodiments are provided so that this disclosure will be thorough and complete, and will fully convey the concept of the invention to those skilled in the art. Therefore, in the drawings, the shapes and dimensions may be exaggerated for clarity, and the same reference numerals will be used throughout to designate the same or like components.

Multilayer Ceramic Capacitor 100

A multilayer ceramic capacitor according to an exemplary embodiment of the present disclosure may include a ceramic body 110 including dielectric layers 111 and having first and second main surfaces 5 and 6 facing each other in a thickness direction, first and second end surfaces 3 and 4 facing each other in a length direction, and first and second side surfaces 1 and 2 facing each other in a width direction; an active layer 20 disposed in the ceramic body 110 and including first internal electrodes 121 each having a first lead part 121a exposed to at least one of the first and second side surfaces and second internal electrodes 122 opposed to the first internal electrodes 121, with the dielectric layers 111 interposed therebetween, and each having a second lead part 122a exposed to at least one of the first and second side surfaces, thereby forming capacitance; an upper cover layer C1 formed on an upper portion of the active layer in the thickness direction; a lower cover layer C2 formed on a lower portion of the active layer in the thickness direction and having a thickness greater than that of the upper cover layer; a first external electrode 131 connected to the first internal electrodes and extended from the side to which the first lead part is exposed to at least one of the first and second main surfaces; a second external electrode 132 connected to the second internal electrodes and extended from the side to which the second lead part is exposed to at least one of the first and second main surfaces;

and insulating layers 140 covering the first and second external electrodes formed on the first and second side surfaces.

Hereinafter, exemplary embodiments of the present disclosure will now be described in detail with reference to the accompanying drawings.

Figure 2:
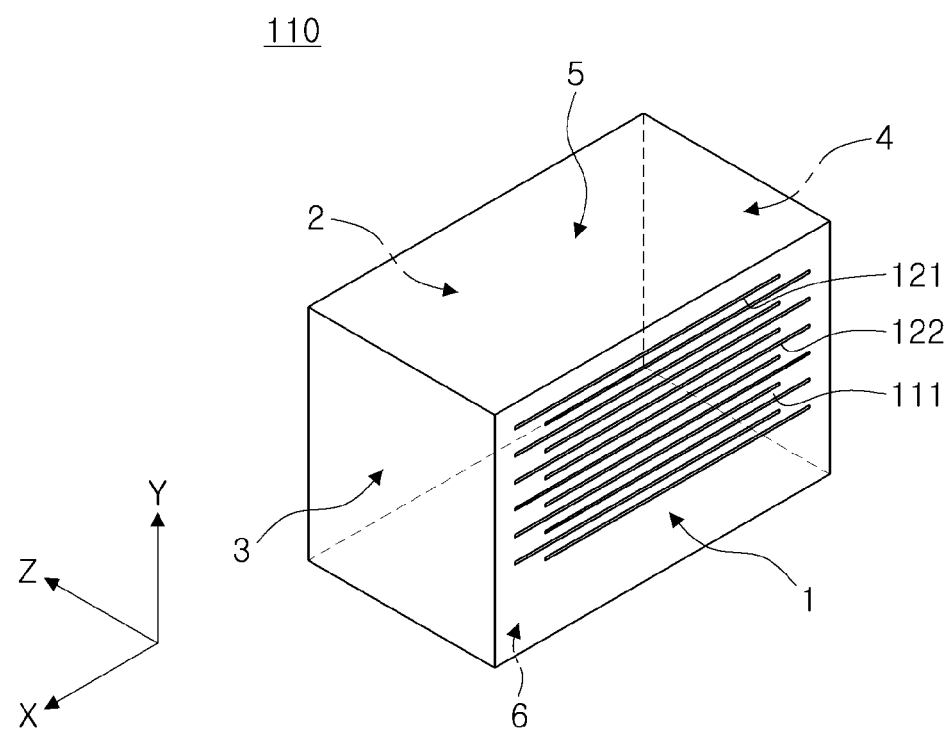
FIG. 2 is a perspective view schematically showing a ceramic body of the multilayer ceramic capacitor according to the exemplary embodiment of the present disclosure.
Figure 3:
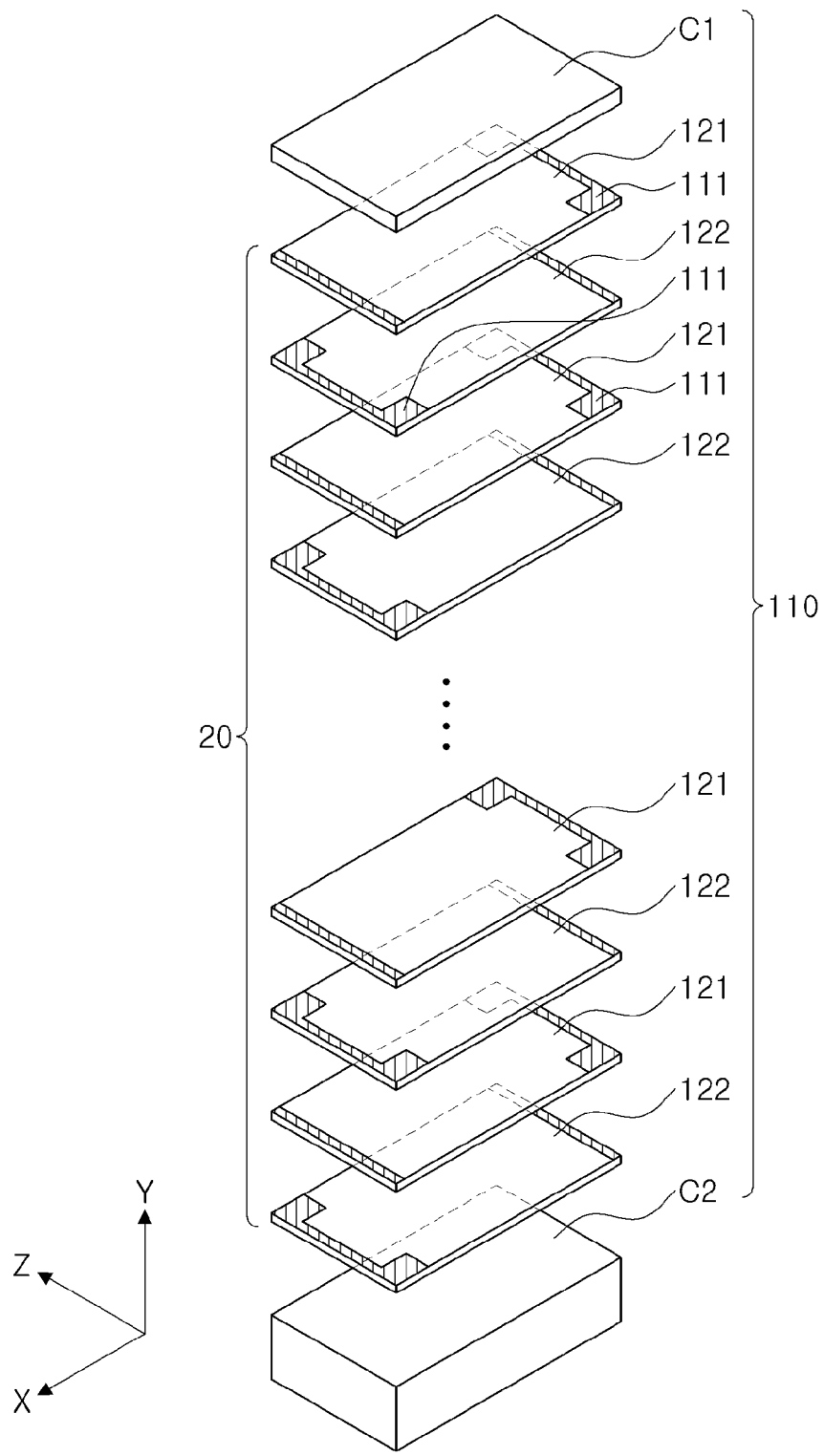
FIG. 3 is an exploded perspective view of the ceramic body of the multilayer ceramic capacitor according to the exemplary embodiment of the present disclosure.

FIG. 1 is a perspective view schematically showing a multilayer ceramic capacitor according to an exemplary embodiment of the present disclosure. FIG. 2 is a perspective view schematically showing a ceramic body of the multilayer ceramic capacitor according to the exemplary embodiment of the present disclosure. FIG. 3 is an exploded perspective view of the ceramic body of the multilayer ceramic capacitor according to the exemplary embodiment of the present disclosure.

Referring to FIG. 1, the multilayer ceramic capacitor according to the exemplary embodiment of the present disclosure may include the ceramic body 110; the first and second external electrodes 131 and 132; and the insulating layers 140.

As shown in FIG. 2, the ceramic body 110 may have the first and second main surfaces 5 and 6 facing each other in the thickness direction, the first and second side surfaces 1 and 2 facing each other in the width direction and connecting the first and second main surfaces to each other, and the first and second end surfaces 3 and 4 facing each other in the length direction and connecting the first and second main surfaces to each other. In the present specification, the first main surface 5 may be referred to as an upper surface, and the second main surface 6 may be referred to as a lower surface.

According to the exemplary embodiment of the present disclosure, a Y-direction refers to a thickness direction of the ceramic body, that is, a direction in which the internal electrodes are stacked, having the dielectric layers therebetween, an X-direction refers to a length direction of the ceramic body, and a Z-direction refers to a width direction of the ceramic body.

Here, the 'thickness direction' refers to a direction in which the dielectric layers are stacked, that is, a 'stacking direction'.

A shape of the ceramic body 110 is not particularly limited, but may be a hexahedral shape as shown. Although the ceramic body 110 does not have a hexahedral shape having a perfect straight line due to sintering shrinkage of ceramic powder at the time of sintering a chip, it may have substantially a hexahedral shape.

The ceramic body 110 may include the active layer 20 corresponding to a part contributing to capacitance formation of the multilayer ceramic capacitor and including the first and second internal electrodes and the upper and lower cover layers C1 and C2 corresponding to upper and lower margin parts in the thickness direction and formed on the upper and lower portions of the active layer 20, respectively, as shown in FIGS. 2 and 3.

The active layer 20 may be formed by repeatedly stacking a plurality of the first and second internal electrodes 121 and 122, with the dielectric layers 111 interposed therebetween.

The first and second internal electrodes may be opposed to each other in the Y-direction, having each dielectric layer 111 therebetween.

The ceramic body 110 may be formed by stacking a plurality of the dielectric layers 111 and then sintering the plurality of dielectric layers 111. A shape and a dimension of the ceramic body 110 and the number of stacked dielectric layers 111 are not limited to examples shown in FIGS. 1 through 3.

In addition, the plurality of dielectric layers 111 configuring the ceramic body 110 may be in a sintered state. Adjacent dielectric layers 111 may be integrated with each other so as not to confirm a boundary therebetween without using a scanning electron microscope (SEM).

In addition, the dielectric layers 111 may include ceramic powder having a high dielectric constant, for example, barium titanate ($BaTiO_3$) based powder or strontium titanate ($SrTiO_3$) based powder. However, the present disclosure is not limited thereto.

According to the exemplary embodiment of the present disclosure, an average thickness of the dielectric layers 111 may be arbitrarily changed in accordance with a capacitance design of the multilayer ceramic capacitor 100, but may be 0.1 to 2.0 μm after being sintered.

The average thickness of the dielectric layers 111 may be measured from an image obtained by scanning a cross-section of the ceramic body 10 in the width direction using the scanning electron microscope (SEM).

For example, with respect to any dielectric layers extracted from an image obtained by scanning the cross-section of the ceramic body 110 in a width and thickness (Y-Z) direction taken along a central portion of the ceramic body 110 in the length (X) direction using the scanning electron microscope (SEM), thicknesses of the respective dielectric layers may be measured in thirty points thereof disposed at equal intervals in the width direction to measure an average value of the thicknesses of the dielectric layers.

The thirty points disposed at equal intervals may be measured in a capacitance forming part that means a region in which the first and second internal electrodes 121 and 122 are overlapped with each other.

In addition, when an average thickness of ten or more dielectric layers is measured, the average thickness of the dielectric layers may be further generalized.

The upper and lower cover layers C1 and C2 may be formed of the same material as that of the dielectric layers 111 and have the same configuration as that of the dielectric layers 111 except that they do not include the internal electrodes.

The upper and lower cover layers C1 and C2 may be formed by stacking a single dielectric layer or two or more dielectric layers on upper and lower surfaces of the active layer 20 in a vertical direction, respectively, and basically serve to prevent damage to the first and second internal electrodes 121 and 122 due to physical or chemical stress.

Figure 4:
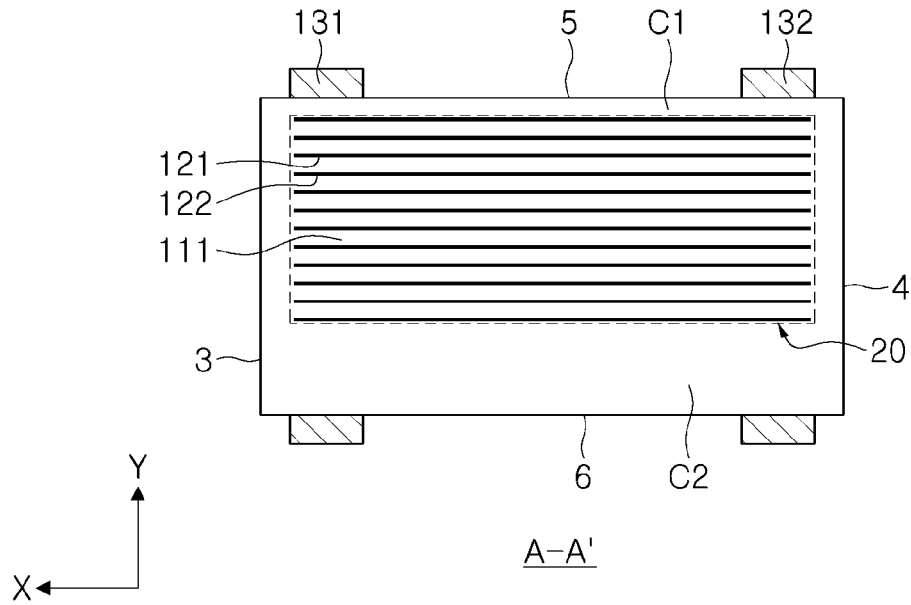
FIG. 4 is a cross-sectional view taken along the line A-A' of FIG. 1.
Figure 5:
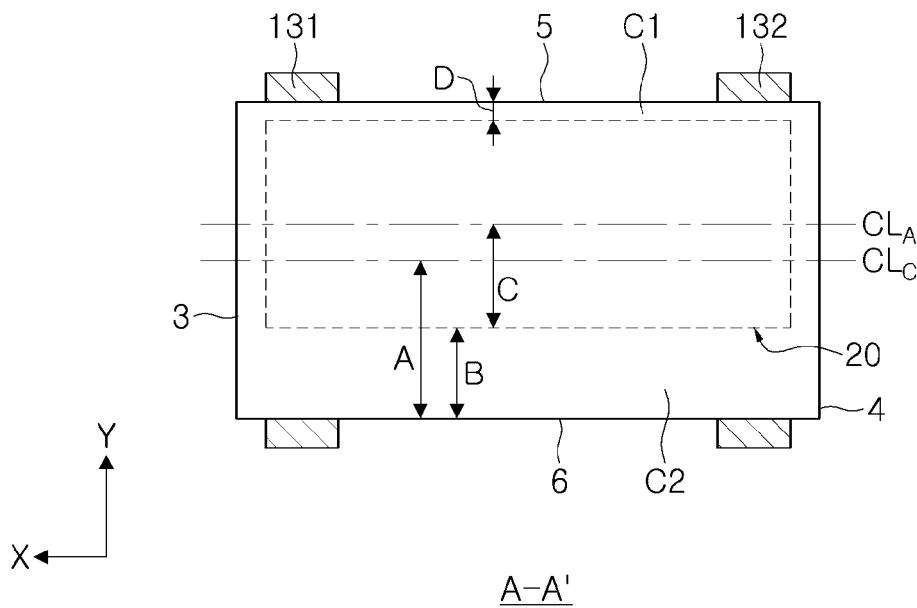
FIG. 5 is a schematic cross-sectional view taken along line A-A' of FIG. 1 in order to describe a dimensional relationship of the multilayer ceramic capacitor of FIG. 1.

FIG. 4 is a cross-sectional view taken along line A-A' of FIG. 1, and FIG. 5 is a schematic cross-sectional view taken along the line A-A' of FIG. 1 in order to describe a dimensional relationship of the multilayer ceramic capacitor of FIG. 1.

As shown in FIGS. 4 and 5, the number of stacked dielectric layers is further increased in the lower cover layer C2 as compared with the upper cover layer C1, whereby the lower cover layer C2 may have a thickness greater than that of the upper cover layer C1.

Referring to FIG. 5, a half of the overall thickness of the ceramic body 110 may be defined as A, a thickness of the lower cover layer C2 may be defined as B, a half of the overall thickness of the active layer 20 may be defined as C, and a thickness of the upper cover layer C1 may be defined as D.

Here, the overall thickness of the ceramic body 110 may mean a distance from the first main surface 5 of the ceramic body 110 to the second main surface 6 thereof, and the overall thickness of the active layer 20 may mean a distance from an upper surface of the first internal electrode 121 formed on the uppermost portion of the active layer 20 to a lower surface of the second internal electrode 122 formed on the lowermost portion of the active layer 20.

In addition, the thickness B of the lower cover layer C2 may mean a distance from the lower surface of the second internal electrode 122 formed on the lowermost portion of the active layer 20 in the thickness direction to the second main surface 6 of the ceramic body 110, and the thickness D of the upper cover layer C1 may mean a distance from the upper surface of the first internal electrode 121 formed on the uppermost portion of the active layer 20 in the thickness direction to the first main surface 5 of the ceramic body 110.

When voltages having opposite polarities are applied to the first and second external electrodes 131 and 132 formed on the multilayer ceramic capacitor 100, the ceramic body 110 expands and contracts in the thickness direction thereof due to an inverse piezoelectric effect occurring in the dielectric layers 111, and both end portions of the ceramic body 110 contract and expand, contrary to the expansion and contraction in the thickness direction of the ceramic body 110, due to the Poisson effect.

Here, a central portion of the active layer 20, a portion maximally expanded and contracted at both end portions of the first and second external electrodes 131 and 132 in the length direction, may be a factor causing acoustic noise.

That is, in the exemplary embodiment of the present disclosure, in order to decrease acoustic noise, points of inflection (PIs) formed on both end surfaces of the ceramic body 110 may be positioned at a position equal to or lower than a central portion $CL_C$ of a thickness of the ceramic body 110 due to a difference between a deformation rate occurring in a central portion $CL_A$ of the active layer 20 and a deformation rate occurring in the lower cover layer C2 when the voltages are applied thereto.

Here, in order to further decrease the acoustic noise, a ratio of the central portion $CL_A$ of the active layer 20 deviating from the central portion $CL_C$ of the ceramic body 110, that is, (B+C)/A, may be in the range of 1.05 to 1.75.

In addition, a ratio of the thickness D of the upper cover layer C1 to the thickness B of the lower cover layer C2, that is, D/B, may be in the range of 0.02 to 0.42.

Further, a ratio of the thickness B of the lower cover layer C2 to the half A of the overall thickness of the ceramic body 110, that is, B/A, may be in the range of 0.33 to 1.52.

Further, a ratio of the half C of the thickness of the active layer 20 to the thickness B of the lower cover layer C2, that is, C/B may be in the range of 0.15 to 2.46.

In the case in which the ratio of the central portion $CL_A$ of the active layer 20 deviating from the central portion $CL_C$ of the ceramic body 110, that is, (B+C)/A, is less than 1.05, an effect of decreasing acoustic noise may not be accomplished, and in the case in which the ratio of the central portion $CL_A$ of the active layer 20 deviating from the central portion $CL_C$ of the ceramic body 110, that is, (B+C)/A, exceeds 1.75, a target capacitance may not be implemented.

In the case in which the ratio of the thickness D of the upper cover layer C1 to the thickness B of the lower cover layer C2, that is, D/B, is less than 0.02, the thickness B of the lower cover layer is excessively greater than the thickness D of the upper cover layer, such that a crack or a delamination may be generated, and a level of capacitance lower than that of a target capacitance may be achieved, such that a capacitance defect may be generated.

In the case in which the ratio of the thickness B of the lower cover layer C2 to the half A of the thickness of the ceramic body 110, that is, B/A, is in the range of 0.33 to 1.52 and the ratio of the half C of the thickness of the active layer 20 to the thickness B of the lower cover layer C2, that is, C/B is in the range of 0.15 to 2.46, the acoustic noise may be further decreased.

On the other hand, in the case in which the ratio of the thickness B of the lower cover layer C2 to the half A of the thickness of the ceramic body 110, that is, B/A, exceeds 1.52 or the ratio of the half C of the thickness of the active layer 20 to the thickness B of the lower cover layer C2, that is, C/B is less than 0.15, a level of capacitance lower than that of a target capacitance may be achieved, such that a capacitance defect may be generated.

Figure 6A:
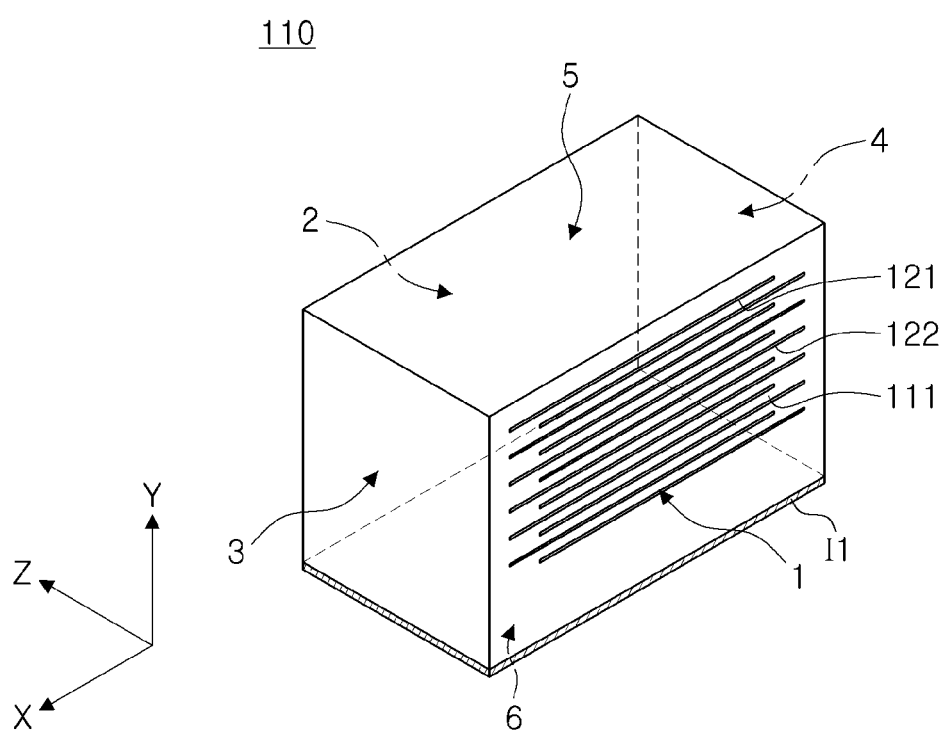
FIGS. 6A and 6B are perspective views schematically showing an identifying part formed in the ceramic body of the multilayer ceramic capacitor according to the exemplary embodiment of the present disclosure.

As shown in FIG. 6A, the upper or lower cover layer C1 or C2 may include an identifying part I1 formed of a dielectric layer, brightness or color of which is different from that of the dielectric layer of the active layer. As an example, as shown in FIG. 6A, the identifying part I1 may be a dielectric layer formed by sintering a single ceramic green sheet or stacking a plurality of ceramic green sheets. The dielectric layer forming the identifying part I1, may have at least one metal selected from a group consisting of nickel (Ni), manganese (Mn), chromium (Cr), and Vanadium (V), added therein such that it may be different from that of the dielectric layer of the active layer in terms of brightness or color when viewed from the outside of the ceramic body 110.

Figure 6B:
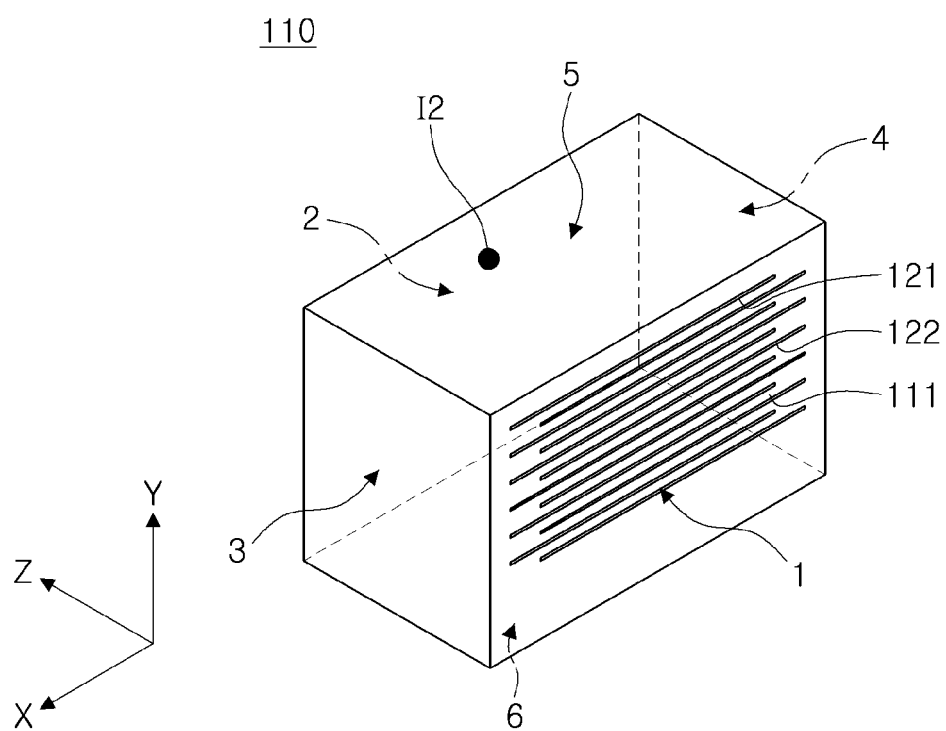

As another example, as shown in FIG. 6B, the identifying part may be formed by completing the stacking of the dielectric layers and then performing laser marking on the upper or lower cover layer C1 or C2 to allow a mark or a symbol to clearly remain even after the dielectric layers are fired. The mark generated by the laser marking is represented by a reference numeral 12 of FIG. 6B.

As another example, although not shown, the multilayer ceramic capacitor according to the exemplary embodiment of the present disclosure may further include a dummy electrode formed by stacking at least one layer in the upper cover layer C1 in the thickness direction of the ceramic body 110 so as to be seen through the first main surface 5 of the ceramic body 110.

Here, a thickness of an upper end portion at which the dummy electrode is not formed in the upper cover layer may be as small as possible in a reliable range so that the dummy electrode is easily seen through the first main surface 5 of the ceramic body 110.

In addition, the dummy electrode disposed at the uppermost portion may be formed in the upper cover layer C1 so as to be as close to the first main surface 5 of the ceramic body 110 as possible so that the dummy electrode is easily seen through the first main surface 5 of the ceramic body 110.

The dummy electrode may be formed of an internal electrode disposed in the same direction as that of the first internal electrode 121 disposed at the uppermost portion of the active layer 20, but may not have a structure in which internal electrodes having opposed polarities are overlapped with each other, having each dielectric layer therebetween.

Therefore, the dummy electrode may not contribute to capacitance formation other than parasitic capacitance generated due to an influence of the external electrodes 131 and 132 or the active layer 20 forming the capacitance.

A structure of the dummy electrode according to the exemplary embodiment of the present disclosure may be variously changed if necessary, and the present disclosure is not limited thereto.

Since the upper surface (first main surface) of the ceramic body on which the upper cover layer C1 is formed and the lower surface (second main surface) of the ceramic body on which the lower cover layer C2 is formed may be obviously identified by the identifying part, a vertical direction in which the multilayer ceramic capacitor 100 is mounted on a printed circuit board may be easily confirmed to prevent the multilayer ceramic capacitor from being mounted on the printed circuit board in a state in which the multilayer ceramic capacitor is vertically overturned, whereby an assembling feature of the printed circuit board on which the multilayer ceramic capacitor is mounted may be improved and a defective rate of the printed circuit board on which the multilayer ceramic capacitor is mounted may be decreased.

A material forming the first and second internal electrodes 121 and 122 is not particularly limited, but may be formed using a conductive paste formed of at least one selected from a group consisting of, for example, a noble metal material such as palladium (Pd), a palladium-silver (Pd—Ag) alloy, or the like, nickel (Ni), and copper (Cu).

Meanwhile, the first and second internal electrodes 121 and 122, which are a pair of electrodes having opposed polarities, may be formed by printing a conductive paste including a conductive metal on the dielectric layers 111 at a predetermined thickness.

An average thickness of the first and second internal electrodes 121 and 122 after being sintered is not particularly limited as long as capacitance may be generated. For example, the average thickness of the first and second internal electrode may be 1.5 μm or less.

An average thickness of the first and second internal electrodes 121 and 122 may be measured from an image obtained by scanning a cross-section of the ceramic body 110 in the width direction using a scanning electron microscope (SEM).

For example, with respect to any internal electrodes extracted from an image obtained by scanning a cross-section of the ceramic body 110 in a width and thickness (Y-Z) direction taken along a central portion of the ceramic body 110 in the length (X) direction using the scanning electron microscope (SEM), thicknesses of the internal electrodes may be measured at thirty points thereof disposed at equal intervals in the width direction to measure an average value of the thicknesses of the internal electrodes.

The thirty points disposed at equal intervals may be measured in the capacitance forming part that means a region in which the first and second internal electrodes 121 and 122 are overlapped with each other.

In addition, when an average thickness of ten or more internal electrodes is measured, the average thickness of the internal electrodes may be further generalized.

According to the exemplary embodiment of the present disclosure, the first and second internal electrodes 121 and 122 may be disposed horizontally with respect to a mounting surface, that is, the first or second main surface 5 or 6, of the multilayer ceramic capacitor.

In the present disclosure, the first and the second elements may mean elements having opposite polarities.

FIGS. 7A through 7G are plan views showing structures of internal electrodes of the multilayer ceramic capacitor according to the exemplary embodiment of the present disclosure.

The first and second internal electrodes 121 and 122 according to the exemplary embodiment of the present disclosure may include first and second lead parts 121a and 122a exposed to external surfaces of the ceramic body and electrically connected to the first and second external electrodes 131 and 132, respectively.

The first and second lead parts 121a and 122a may be exposed to at least one side surface of the ceramic body, and the internal electrodes of the multilayer ceramic capacitor according to the exemplary embodiment of the present disclosure may be changed into various forms.

The first and second lead parts 121a and 122a may be exposed to at least one side surface of the ceramic body. That is, the first and second lead parts 121a and 122a may be exposed to the first or second side surface 1 or 2 or be exposed to the first and second side surfaces 1 and 2.

Figure 7A:
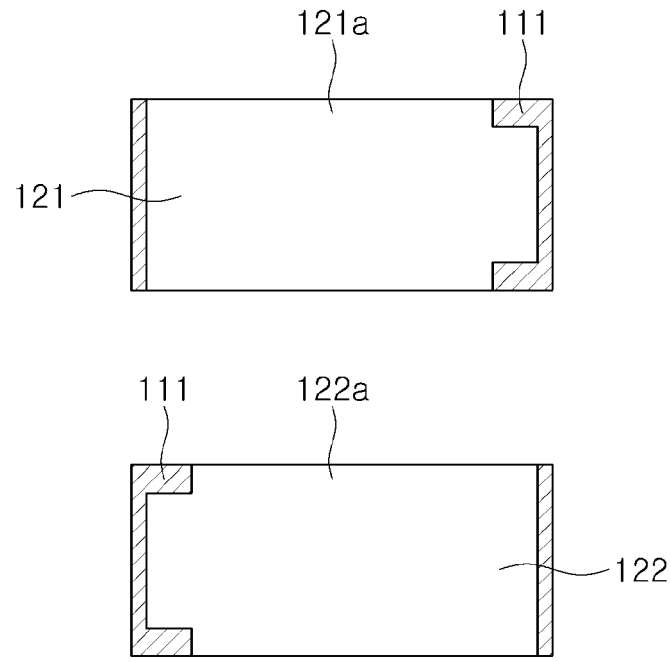
FIGS. 7A through 7G are plan views showing structures of internal electrodes of the multilayer ceramic capacitor according to the exemplary embodiment of the present disclosure.

Further, referring to FIG. 7A, regions of the first and second lead parts 121a and 122a exposed to at least one of the first and second side surfaces may be overlapped with each other. In the case in which regions of the first and second lead parts 121a and 122a exposed to at least one of the first and second side surfaces are overlapped with each other as shown in FIG. 7A, since an additional capacitance is formed by the overlap regions of the lead parts, a high capacitance multilayer ceramic capacitor may be provided.

Figure 7B:
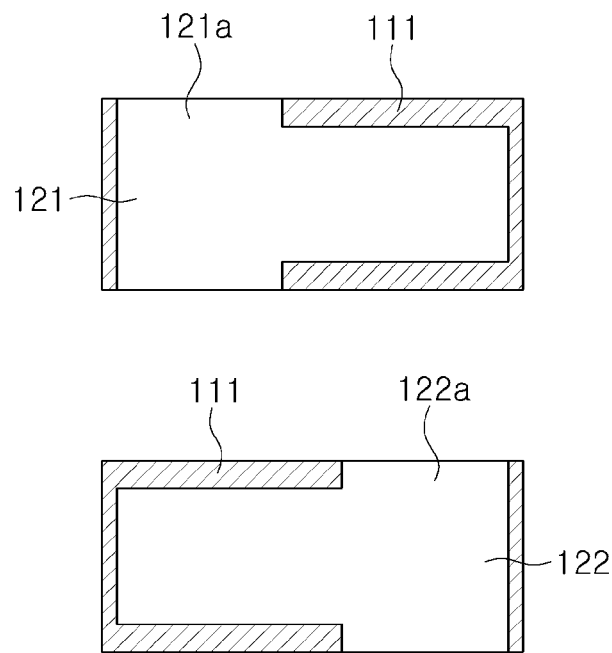

Further, as shown in FIG. 7B, regions of the first and second lead parts 121a and 122a exposed to at least one side surface of the ceramic body may not be overlapped with each other. In the case in which the first and second lead parts are exposed as much as possible without having the regions overlapped with each other, a phenomenon that the first and second internal electrodes are connected to each other due to a spreading of the internal electrode material at the time of cutting the ceramic body may be prevented. In addition, this case may be advantageous for removing remaining carbons at the time of performing sintering.

Figure 7C:
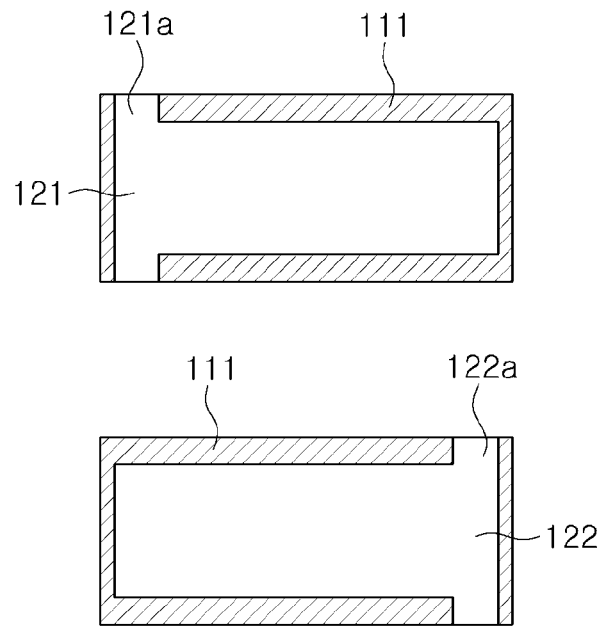

Further, as shown in FIG. 7C, widths of the first and second lead parts 121a and 122a exposed to the side surface of the ceramic body may be smaller than those of the external electrodes in consideration of widths of external electrodes to be subsequently formed. In the case in which the widths of the first and second lead parts exposed to the side surface of the ceramic body are smaller than those of the external electrodes, the external electrodes may cover the exposed first and second lead parts, such that insulating layers for covering the first and second lead parts may not be required. In this case, the insulating layers may be formed to cover only the external electrodes, which will be described below.

Figure 7D:
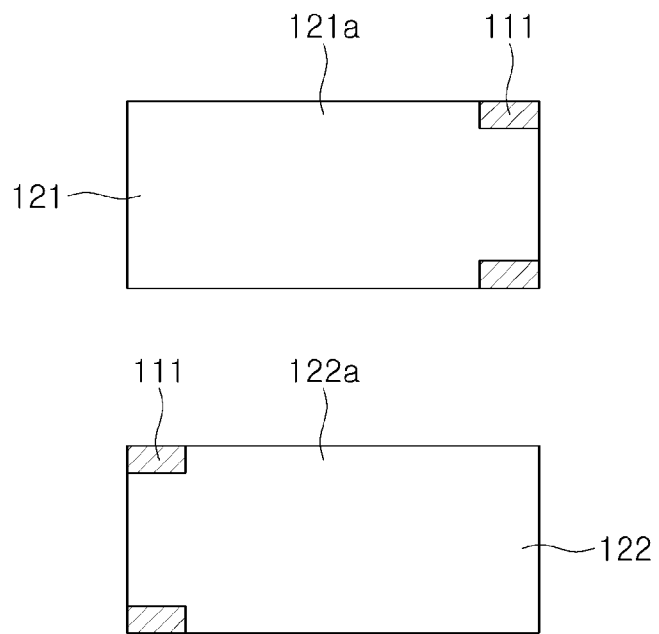
Figure 7E:
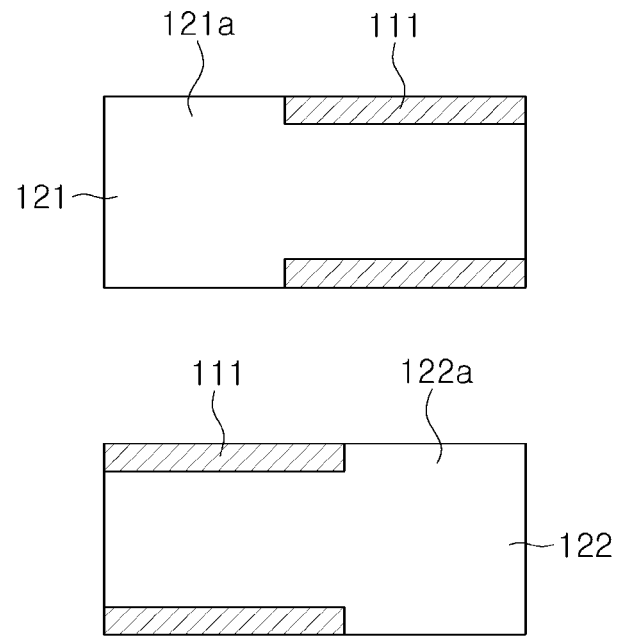
Figure 7F:
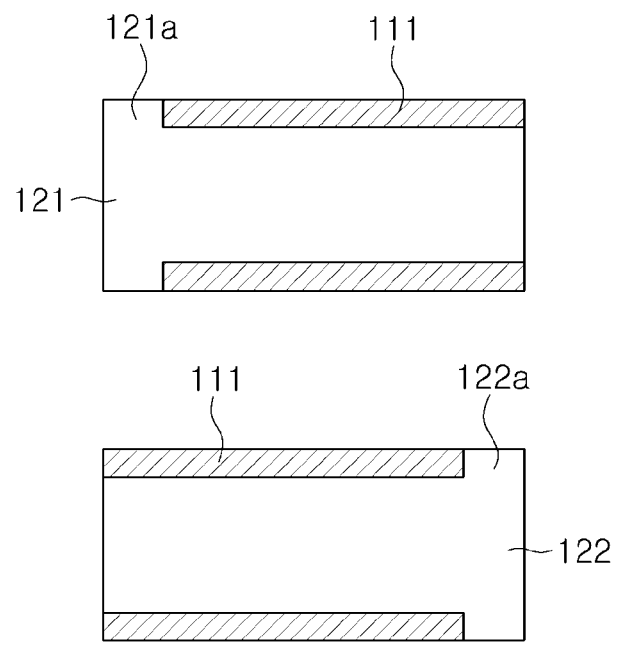

In addition, as shown in FIGS. 7D through 7F, the first and second internal electrodes 121 and 122 may be exposed to the first and second end surfaces while having the first and second lead parts exposed to at least one side surface of the ceramic body. As described above with reference to FIGS. 7A through 7C, also in FIGS. 7D through 7F, exposed regions of the first and second lead parts 121a and 122a may overlap each other. Alternatively, the exposed regions of the first and second lead parts may do not overlap each other. Further, the exposed regions of the first and second lead parts may have widths smaller than those of the external electrodes.

In the case in which the first and second internal electrodes 121 and 122 are exposed to the first and second end surfaces and the first and second lead parts 121a and 122a exposed to the side surface of the ceramic body have overlap regions as described above, a multilayer ceramic capacitor capable of securing high capacitance in the same area may be implemented.

In the case in which the first and second internal electrodes 121 and 122 are exposed to the first and second end surfaces of the ceramic body, the insulating layers 140 may also be formed on the first and second end surfaces in order to protect the internal electrodes and block a short circuit.

Figure 7G:
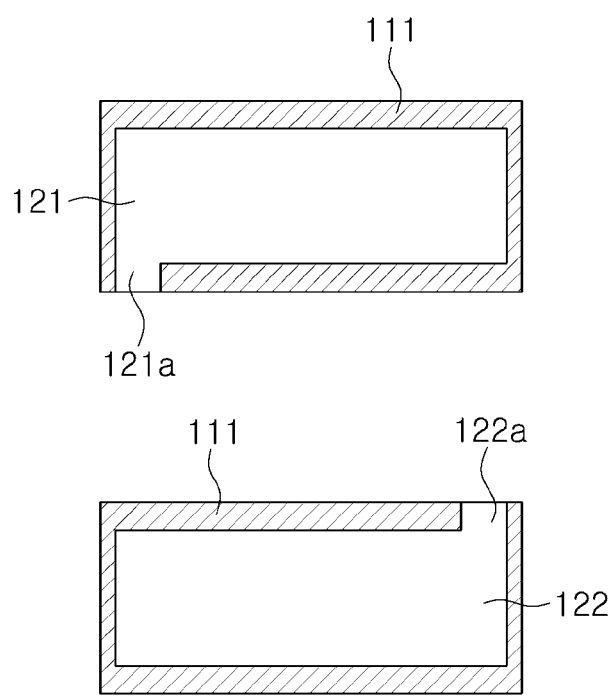

As shown in FIG. 7G, the first and second lead parts 121a and 122a of the internal electrodes according to the exemplary embodiment of the present disclosure may be exposed to different side surfaces. That is, the first lead part 121a may be exposed to the first side surface, and the second lead part 122a may be exposed to the second side surface.

The first and second internal electrodes 121 and 122 may be electrically insulated from each other by the dielectric layers 111 disposed therebetween.

That is, the first and second internal electrodes 121 and 122 may be electrically connected to the first and second external electrodes 131 and 132 through the first and second lead parts exposed to the side surface of the ceramic body 110.

Therefore, when a voltage is applied to the first and second external electrodes 131 and 132, charges may be accumulated between the first and second internal electrodes 121 and 122 opposed to each other. In this case, capacitance of the multilayer ceramic capacitor 100 may be in proportion to an overlap region of the first and second internal electrodes 121 and 122.

FIGS. 8A through 8E are perspective views showing the ceramic body and external electrodes of the multilayer ceramic capacitor according to the exemplary embodiment of the present disclosure.

Referring to FIGS. 8A through 8E, the first and second external electrodes 131 and 132 may be connected to the first and second internal electrodes 121 and 122, respectively.

The first external electrode 131 may be electrically connected to the first internal electrode and be extended from at least one of the first and second side surfaces to at least one of the first and second main surfaces and the second side surface, and the second external electrode 132 may be electrically connected to the second internal electrode and be extended from at least one of the first and second side surfaces to at least one of the first and second main surfaces and the second side surface.

Figure 8A:
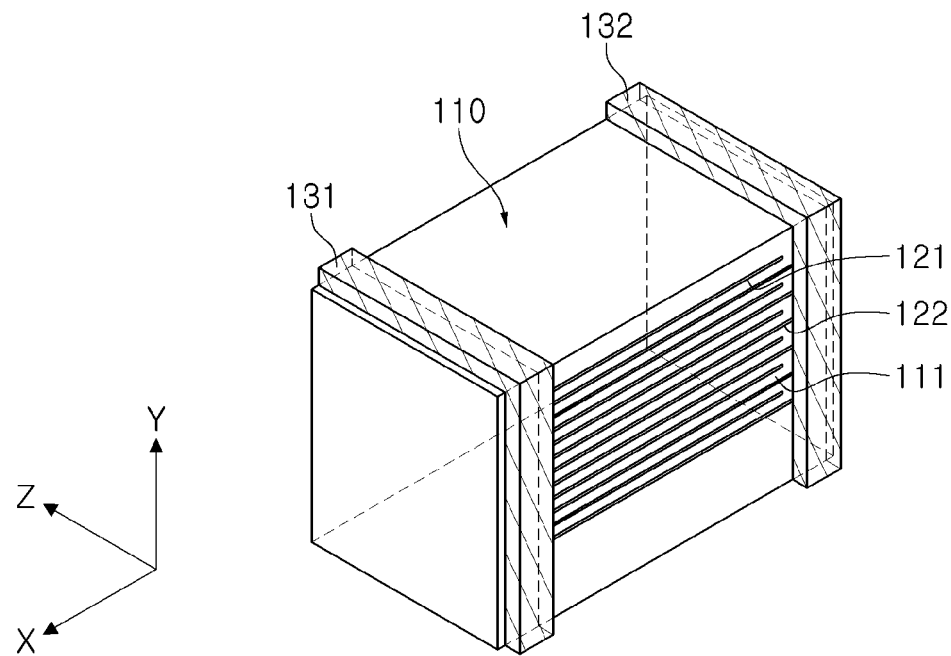
FIGS. 8A through 8E are perspective views showing the ceramic body and external electrodes of the multilayer ceramic capacitor according to the exemplary embodiment of the present disclosure.
Figure 8B:
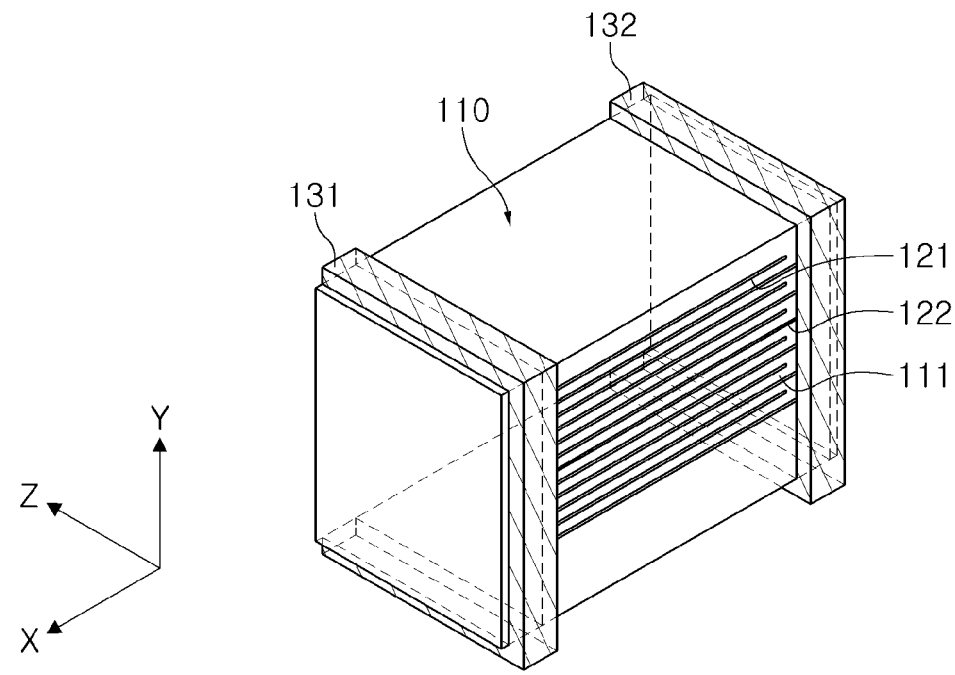
Figure 8C:
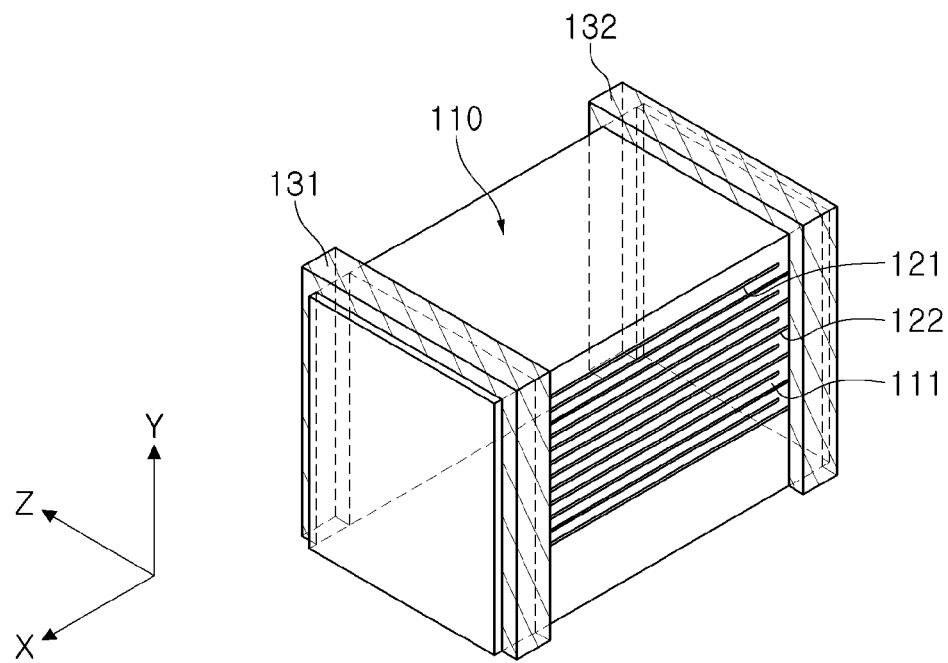
Figure 8D:
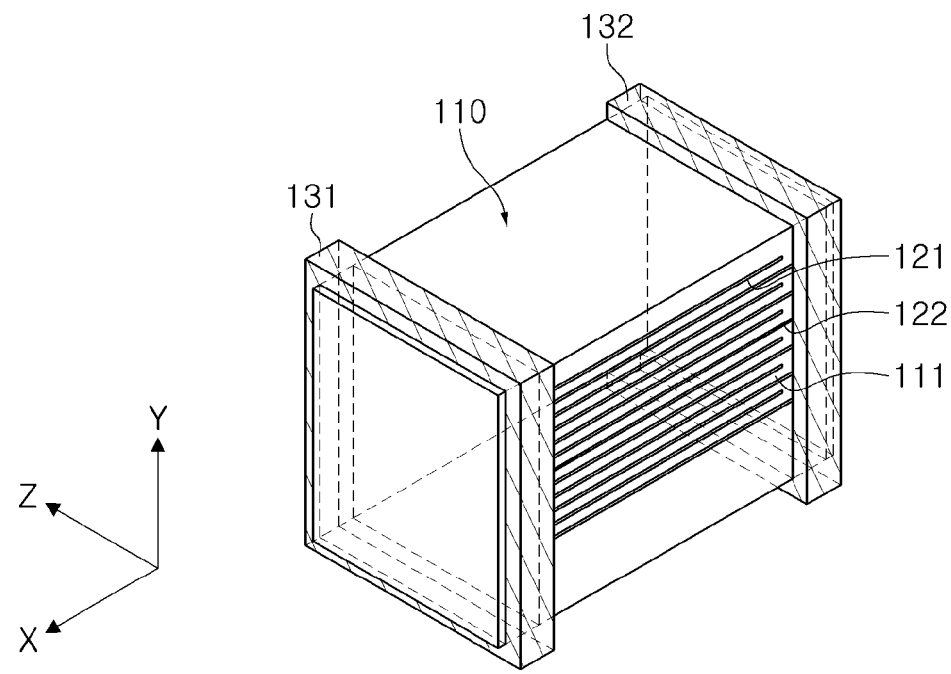
Figure 8E:
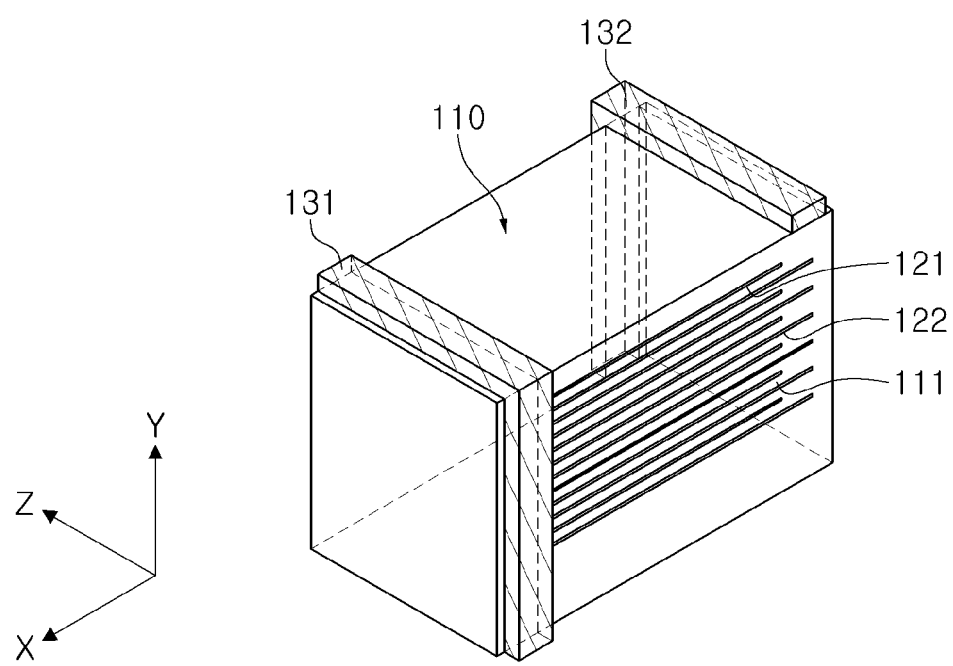

More specifically, the first and second external electrodes 131 and 132 may be extended from the first side surface to one of the first and second main surfaces (See FIG. 8A), be extended from the first side surface to the first and second main surfaces (See FIG. 8B), or be extended from the first side surface to one of the first and second main surfaces and the second side surface (See FIG. 8C).

The first and second external electrodes 131 and 132 may be extended from the first side surface to the first and second main surfaces and the second side surface. In this case, the first and second external electrodes may have a "☐" shape (See FIG. 8D).

In addition, the first and second external electrodes 131 and 132 may be formed on different side surfaces and then be extended to the same main surface. In other words, the first external electrode 131 may be formed on the first side surface and the second external electrode 132 may be formed on the second side surface. In this case, the first or second external electrode may be extended from the first or second side surface to at least one of the first and second main surfaces, respectively (See FIG. 8E).

The first and second external electrodes may be spaced apart from the first and second end surfaces, respectively, by a predetermined interval.

The form of the external electrode described above is not limited thereto, but may be appropriately changed. However, in order to dispose the internal electrode horizontally with respect to the mounting surface, the external electrode may be extended to at least one of the first and second main surfaces of the ceramic body.

The first and second external electrodes 131 and 132 may be formed of the same conductive material as that of the internal electrodes, but are not limited thereto. For example, the first and second external electrodes 131 and 132 may be formed of copper (Cu), silver (Ag), nickel (Ni), or the like.

The first and second external electrodes 131 and 132 may be formed by applying a conductive paste prepared by adding a glass frit to a metal powder to external surfaces of the ceramic body 110 and performing a sintering process.

FIGS. 9A through 9F are perspective views showing the ceramic body 110, the external electrodes 131 and 132, and insulating layers 140 of the multilayer ceramic capacitor according to the exemplary embodiment of the present disclosure.

Meanwhile, according to the exemplary embodiment of the present disclosure, the insulating layers 140 may be formed to cover the first and second external electrodes 131 and 132 formed on the first and second side surfaces of the ceramic body 110.

Figure 9A:
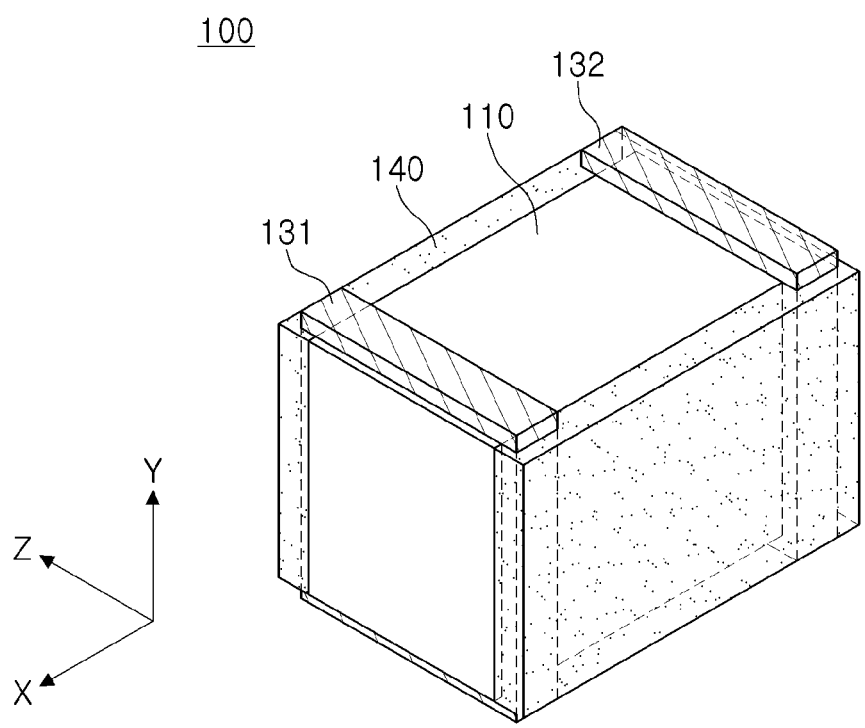
FIGS. 9A through 9F are perspective views showing the ceramic body, the external electrodes, and insulating layers of the multilayer ceramic capacitor according to the exemplary embodiment of the present disclosure.

As shown in FIG. 9A, the insulating layers 140 according to the exemplary embodiment of the present disclosure may cover the first and second external electrodes formed on the first and second side surfaces and the first and second side surfaces.

That is, the insulating layers may cover the external electrodes formed on the first and second side surfaces, such that the external electrodes may not be exposed on the first and second side surfaces and the first or second main surface to which the external electrodes are extended and on which the external electrodes are exposed may serve as the mounting surface. In the case in which the first or second main surface serves as the mounting surface as in the present disclosure, the internal electrodes may be disposed horizontally with respect to the mounting surface.

Since the dielectric layers have piezoelectric and electrostrictive characteristics, a piezoelectric phenomenon is generated between the internal electrodes when a direct current (DC) or alternating current (AC) voltage is applied to the multilayer ceramic capacitor, such that vibrations may be generated.

These vibrations may be transferred to a printed circuit board on which the multilayer ceramic capacitor is mounted through a soldering part connected to the multilayer ceramic capacitor, such that the overall printed circuit board becomes an acoustic reflective surface to generate a vibratory sound regarded as noise.

The vibratory sound may correspond to an audible frequency in a region of 20 to 20,000 Hz, which may cause listener discomfort and is referred to as acoustic noise.

A transfer of the vibrations to the printed circuit board may be further generated in the case in which the internal electrodes and the dielectric layers are disposed to be perpendicular to a mounting surface (board), rather than in the case in which the internal electrodes and the dielectric layers are disposed horizontally with respect to the mounting surface (board). Therefore, the internal electrodes and the dielectric layers may be disposed to be perpendicular to the mounting surface in order to decrease the acoustic noise. However, in the case in which the lead parts of the internal electrodes are exposed to the same surface of the ceramic body in order to increase capacitance and improve a mounting density, the dielectric layers and the internal electrodes may be disposed to be perpendicular to the mounting surface. However, in the case of the present disclosure, the external electrodes are extended to at least one of the first and second main surfaces to allow the first or second main surface to serve as the mounting surface, such that the internal electrodes and the dielectric layers may be disposed horizontally with respect to the mounting surface.

In addition, the acoustic noise may be closely related to the disposition of soldering parts at the time of mounting the multilayer ceramic capacitor on the printed circuit board. That is, as the number of solders disposed on a surface perpendicular to the mounting surface increases, vibrations by a piezoelectric phenomenon may be more easily transferred to the printed circuit board, such that the acoustic noise may increase. Therefore, the number of solders formed on the surface of the multilayer ceramic capacitor perpendicular to the mounting surface may be reduced as much as possible, in order to decrease the acoustic noise.

The solders mounted on the mounting surface may be extended upwardly to the surface perpendicular to the mounting surface through the external electrodes due to surface tension. In the case of the present disclosure, the external electrodes exposed to the surface perpendicular to the mounting surface are covered by the insulating layer, such that the solders may not be extended upwardly or may be slightly, extended upwardly, whereby the acoustic noise may be significantly decreased.

Figure 9B:
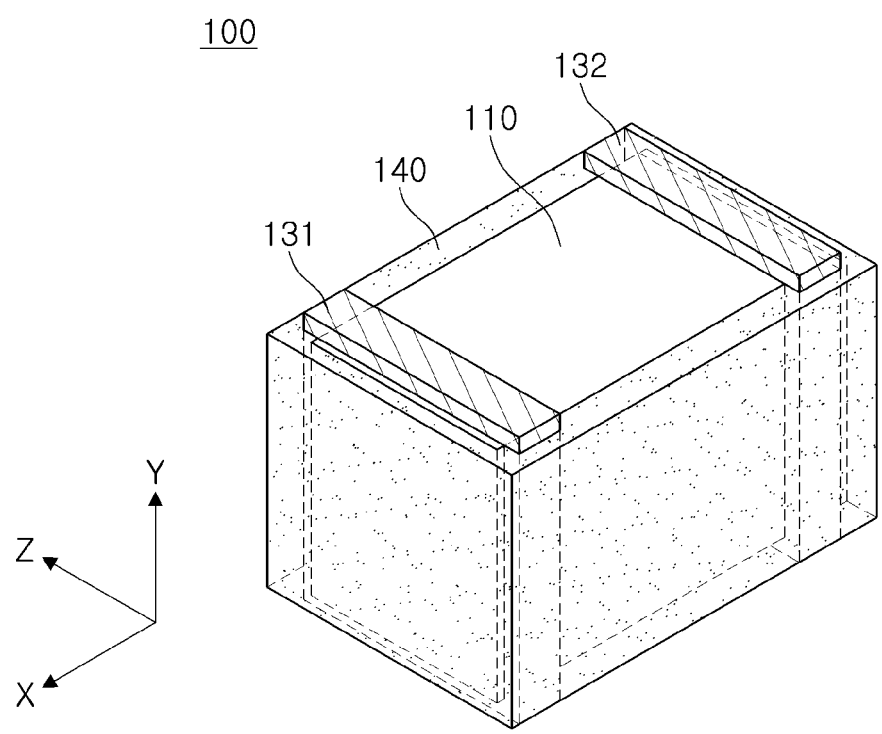

In addition, in the case in which the first and second internal electrodes are exposed to the first and second end surfaces of the ceramic body, the insulating layer 40 may cover the first and second external electrodes, the first and second side surfaces, and the first and second end surfaces, as shown in FIG. 9B.

Figure 9C:
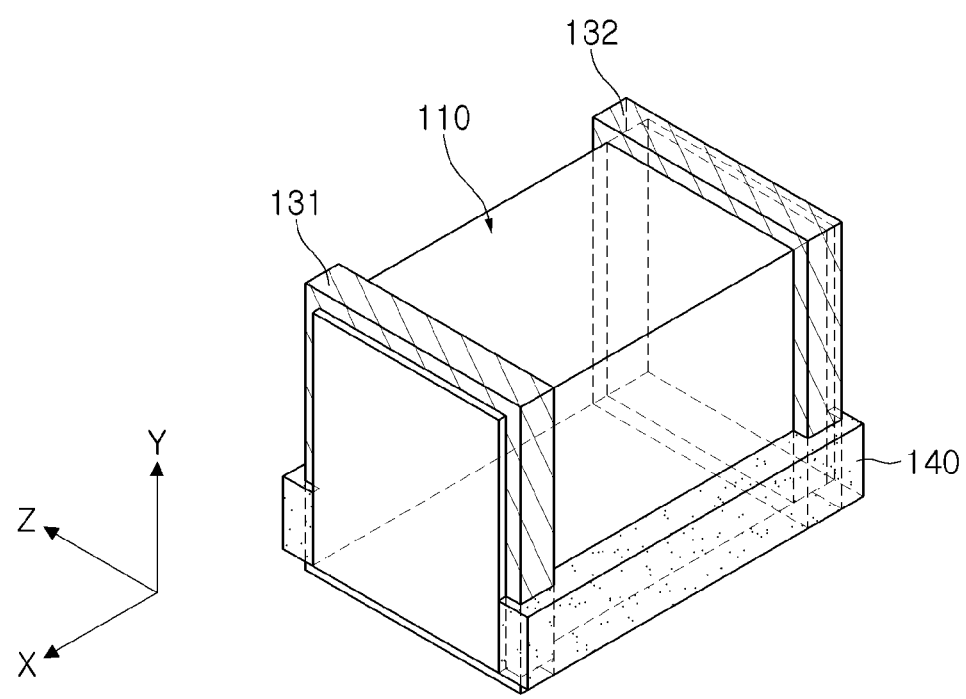
Figure 9D:
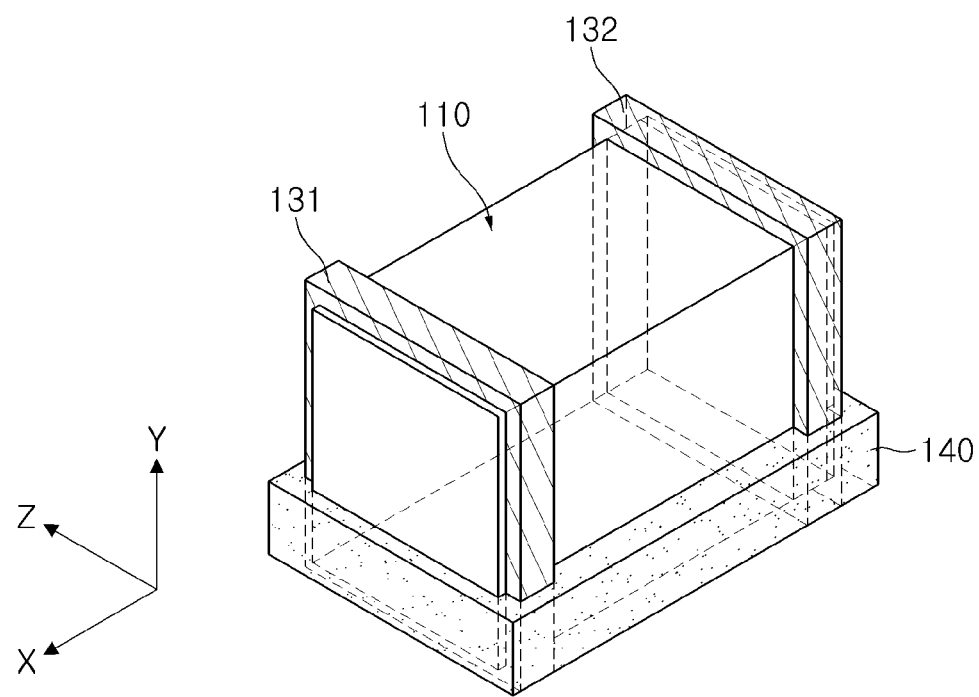

As shown in FIGS. 9C and 9D, the insulating layer is not formed on the entirety of the side surface of the ceramic body in the thickness direction, but may be formed at a region corresponding to a predetermined height from the mounting surface of the ceramic body mounted on the printed circuit board. Since the insulating layers 140 according to the embodiment of the present disclosure may be provided to prevent the solder from being extended upwardly to the surface perpendicular to the mounting surface (first or second main surface) of the ceramic body. Thus, even in the case in which the insulating layers 140 are formed only to a predetermined height from the mounting surface, the aspect of the prevention may be accomplished, and an amount of a material used to form the insulating layer may be decreased to lead to a reduction of costs required therefor.

Figure 9E:
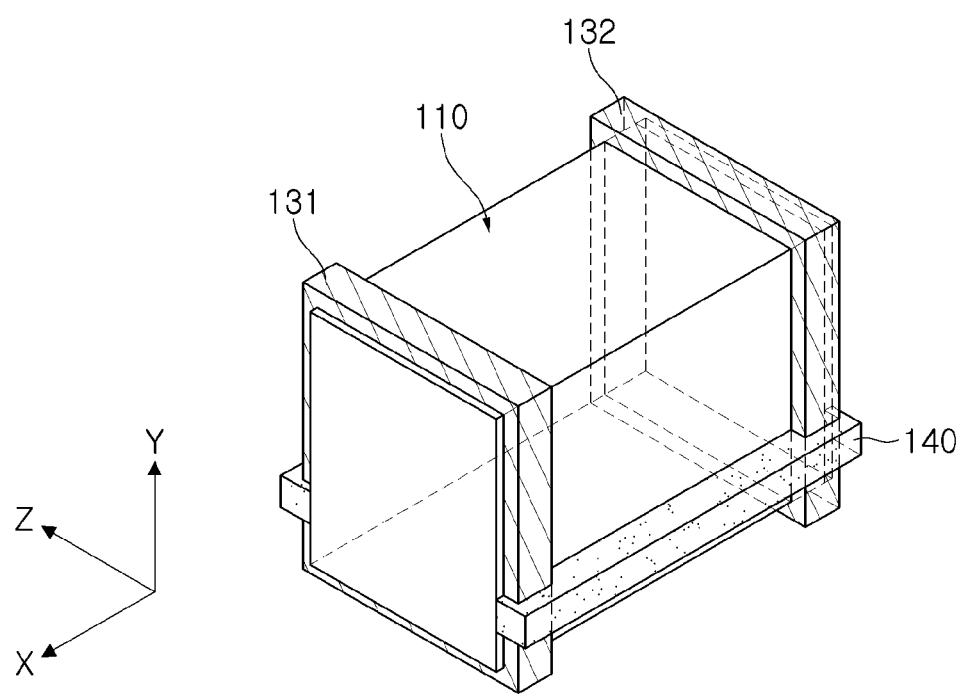
Figure 9F:
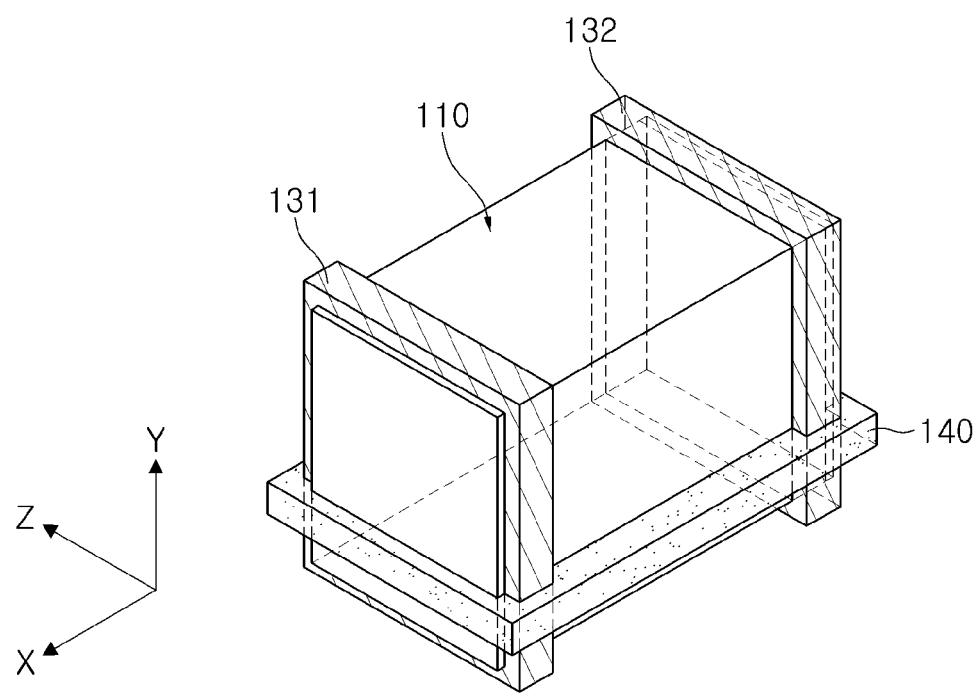

Further, as shown in FIGS. 9E and 9F, the insulating layer may be spaced apart from the mounting surface of the ceramic body by a predetermined interval. In the case in which the insulating layer is spaced apart from the mounting surface by a predetermined interval as shown in FIGS. 9E and 9F, the solders may be slightly extended upwardly through the external electrodes not covered by the insulating layer, but adhesion strength may be improved. Therefore, the insulating layer may be spaced apart from the mounting surface by a predetermined interval, as long as acoustic noise is not affected thereby.

As shown in FIGS. 9C through 9F, in the case in which the insulating layer does not cover the overall side surfaces or the overall end surfaces of the ceramic body, but only cover a predetermined height of the side surfaces or the end surfaces, the widths of the exposed regions of the first and second lead parts of the internal electrodes are smaller than widths of the first and second external electrodes as shown in FIG. 7C, such that the internal electrodes may not be exposed to the external surfaces of the ceramic body.

The insulating layers 140 may be formed of an organic resin, a ceramic, an inorganic filler, a glass, or a mixture thereof, but is not limited thereto.

According to the exemplary embodiment of the present disclosure, the shape of the internal electrode, the shape of the external electrode, and the shape of the insulating layer described above may be freely combined with each other.

Board 200 having Multilayer Ceramic Capacitor Mounted Thereon

A board having a multilayer ceramic capacitor mounted thereon according to another exemplary embodiment of the present disclosure may include a printed circuit board 210 having first and second electrode pads 221 and 222 disposed thereon; and the multilayer ceramic capacitor 100 mounted on the printed circuit board, wherein the multilayer ceramic capacitor includes: a ceramic body including dielectric layers and having first and second main surfaces facing each other in a thickness direction, first and second end surfaces facing each other in a length direction, and first and second side surfaces facing each other in a width direction; an active layer disposed in the ceramic body and including first internal electrodes each having a first lead part exposed to at least one of the first and second side surfaces and second internal electrodes opposed to the first internal electrodes, with the dielectric layers interposed therebetween, and each having a second lead part exposed to at least one of the first and second side surfaces, thereby forming capacitance; an upper cover layer formed on an upper portion of the active layer in the thickness direction; a lower cover layer formed on a lower portion of the active layer in the thickness direction and having a thickness greater than that of the upper cover layer; a first external electrode connected to the first internal electrodes and extended from the side to which the first lead part is exposed to at least one of the first and second main surfaces; a second external electrode connected to the second internal electrodes and extended from the side to which the second lead part is exposed to at least one of the first and second main surfaces; and insulating layers covering the first and second external electrodes formed on the first and second side surfaces.

Figure 10:
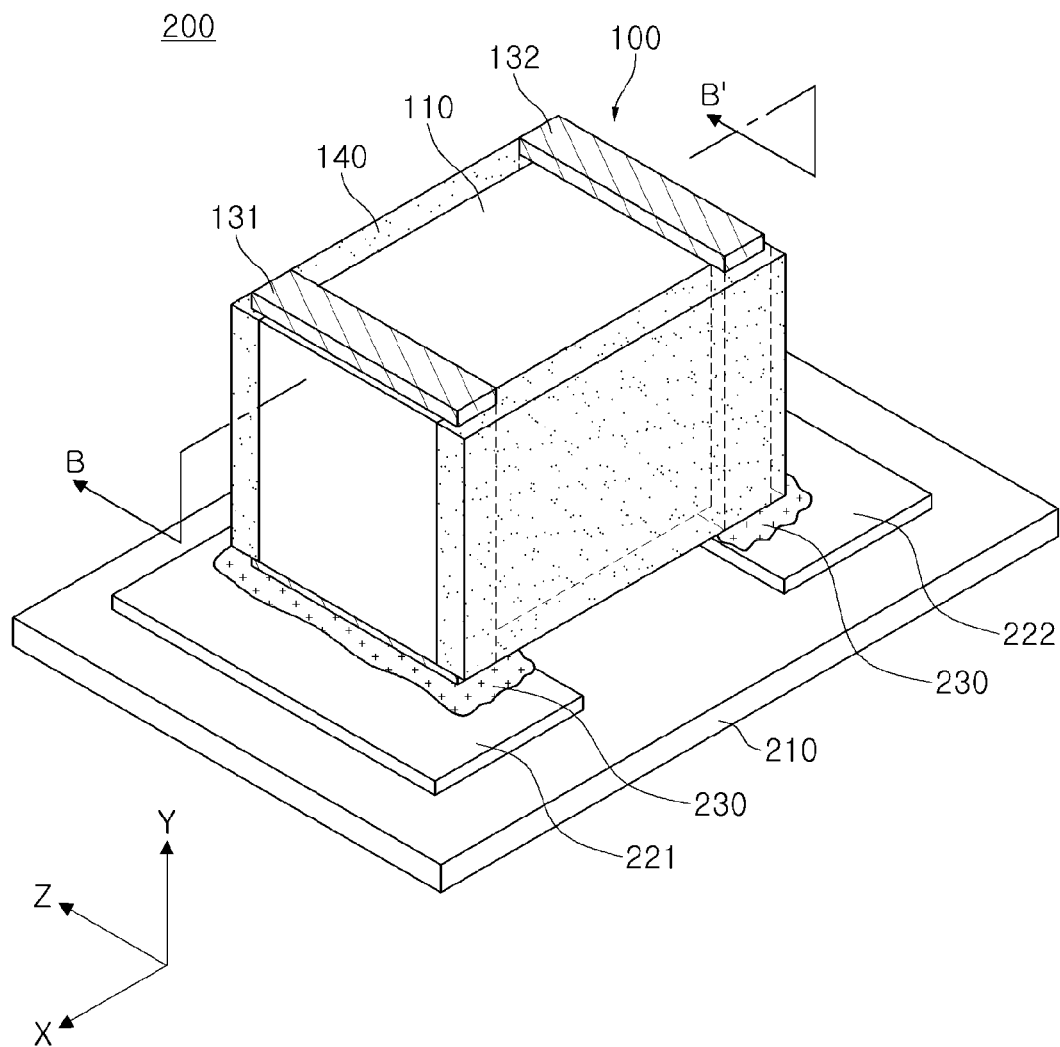
FIG. 10 is a perspective view schematically showing a board having a multilayer ceramic capacitor mounted thereon according to another exemplary embodiment of the present disclosure.
Figure 11:
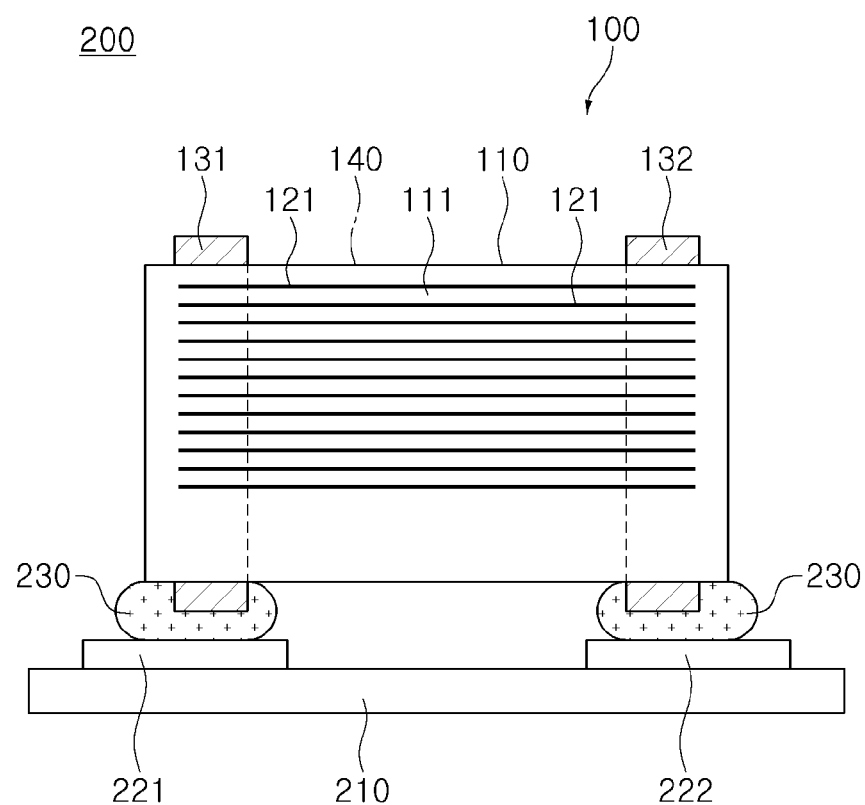
FIG. 11 is a cross-sectional view of the board having a multilayer ceramic capacitor mounted thereon, taken along the line B-B' of FIG. 10.

FIG. 10 is a perspective view schematically showing a board having a multilayer ceramic capacitor mounted thereon according to another exemplary embodiment of the present disclosure, and FIG. 11 is a cross-sectional view of the board having a multilayer ceramic capacitor mounted thereon, taken along line B-B' of FIG. 10.

Referring to FIGS. 10 and 11, the board 200 having the multilayered ceramic capacitor 100 mounted thereon according to another exemplary embodiment of the present disclosure may include the printed circuit board 210 having the multilayered ceramic capacitor 100 mounted thereon and the first and second electrode pads 221 and 222 formed on an upper surface of the printed circuit board 210 to be spaced apart from each other.

Here, the first and second external electrodes 131 and 132 extended to the first or second main surface of the multilayer ceramic capacitor 100 may be electrically connected to the printed circuit board 210 by a soldering portion 230 while they are positioned on and in contact with the first and second electrode pads 221 and 222, respectively.

Since the multilayer ceramic capacitor 100 mounted on the printed circuit board 210 according to another exemplary embodiment of the present disclosure is the same as the multilayer ceramic capacitor described above, a description thereof will be omitted in order to avoid an overlapped description.

Experimental Example

Individual multilayer ceramic capacitors according to inventive and comparative examples were manufactured as follows.

A slurry including a barium titanate ($BaTiO_3$) powder or the like was coated on carrier films and dried, to prepare a plurality of ceramic green sheets having a thickness of 1.8 µm.

Next, a conductive paste for an internal electrode formed of nickel was coated on the ceramic green sheets by using a screen printing method to form internal electrodes.

The ceramic green sheets were laminated in an amount of about 370 layers to form a laminate, and the ceramic green sheets on which the internal electrodes are not formed were stacked in a larger amount on a lower portion of the ceramic green sheets provided with the internal electrodes, in comparison to the amount stacked on the upper portion thereof. The laminate was subjected to isostatic pressing at about 85° C. under about 1000 kgf/cm².

Then, the pressed laminate was cut into individual chips. Each of the cut chips was subjected to debindering at about 230° C. in an atmospheric atmosphere for about 60 hours.

Thereafter, the resultant chip was sintered at 1200° C. in a reduction atmosphere under an oxygen partial pressure of $10^{-11}$ atm to $10^{-10}$ atm, lower than an equilibrium oxygen partial pressure of Ni/NiO, such that the internal electrodes were not oxidized. After being sintered, a chip size of a multilayer chip capacitor was defined as a length×width (L×W) of about 1.64 mm×0.88 mm (L×W, 1608 size). Here, a manufacturing tolerance was set within a range of ±0.1 mm in length×width (L×W), and when this condition is satisfied, acoustic noise was measured. (See Table 1).

TABLE 1

| Sample | A (μm) | B (μm) | C (μm) | (B + C)/A | AN (dB) | Capacitance implementation rate |
|---|---|---|---|---|---|---|
| 1* | 542 | 35 | 189 | 0.41328 | 24.3 | OK |
| 2* | 537 | 29 | 299 | 0.6108 | 28.9 | OK |
| 3* | 485 | 136 | 172 | 0.63505 | 25.5 | OK |
| 4* | 496 | 36 | 287 | 0.65121 | 30.9 | OK |
| 5* | 398 | 200 | 121 | 0.80653 | 23.1 | OK |
| 6* | 502 | 150 | 258 | 0.81275 | 24.9 | OK |
| 7* | 544 | 171 | 295 | 0.85662 | 28 | OK |
| 8* | 402 | 59 | 359 | 1.0398 | 30.5 | OK |
| 9 | 392 | 70 | 347 | 1.06378 | 16.5 | OK |
| 10 | 484 | 414 | 103 | 1.06818 | 16.6 | OK |
| 11 | 421 | 356 | 115 | 1.11876 | 16.5 | OK |
| 12 | 407 | 162 | 316 | 1.17445 | 18.6 | OK |
| 13 | 377 | 322 | 126 | 1.18833 | 18.1 | OK |
| 14 | 531 | 340 | 315 | 1.23352 | 16.7 | OK |
| 15 | 448 | 320 | 251 | 1.27455 | 17 | OK |
| 16 | 391 | 269 | 247 | 1.31969 | 16.5 | OK |
| 17 | 450 | 324 | 275 | 1.33111 | 17.7 | OK |
| 18 | 471 | 348 | 287 | 1.3482 | 16.5 | OK |
| 19 | 373 | 407 | 110 | 1.38606 | 16.6 | OK |
| 20 | 439 | 398 | 223 | 1.41458 | 16.5 | OK |
| 21 | 501 | 595 | 129 | 1.44511 | 17 | OK |
| 22 | 424 | 419 | 205 | 1.4717 | 18.7 | OK |
| 23 | 492 | 515 | 225 | 1.50407 | 17.4 | OK |
| 24 | 438 | 463 | 197 | 1.50685 | 16.5 | OK |
| 25 | 505 | 551 | 220 | 1.52673 | 16.6 | OK |
| 26 | 545 | 736 | 167 | 1.65688 | 17.7 | OK |
| 27 | 390 | 570 | 95 | 1.70513 | 16.7 | OK |
| 28 | 535 | 810 | 120 | 1.73832 | 16.8 | OK |
| 29* | 470 | 741 | 90 | 1.76809 | 16.6 | NG |
| 30* | 508 | 839 | 79 | 1.80709 | 16.5 | NG |

*Comparative Example,
AN: acoustic noise

Table 1 shows dimensional data of respective parts, which were measured based on an image obtained by scanning a cross-section of the ceramic body 110 in the length-thickness (L-T) directions cut in a central portion of the ceramic body 110 of the multilayer ceramic capacitor 100 in the width (W) direction thereof, using a scanning electron microscope (SEM).

Here, as described above, a half of the overall thickness of the ceramic body 110 was defined as A, a thickness of the lower cover layer C2 was defined as B, and a half of the overall thickness of the active layer 20 was defined as C.

In order to measure acoustic noise, one sample (multilayer ceramic capacitor) per one substrate for acoustic noise measurement was mounted on a printed circuit board while upper and lower portions of the sample are identified and then, the printed circuit board was mounted on a measuring jig.

Then, DC voltage and voltage variation were applied to both terminals of the sample mounted on the measuring jig by using a DC power supply and a function generator. The acoustic noise was measured through a microphone installed directly above the printed circuit board.

Here, in the case in which (B+C)/A was approximately 1, it can be appreciated that the central portion of the active layer 20 did not significantly deviate from the central portion of the ceramic body 110.

In the case in which (B+C)/A was greater than 1, it can be appreciated that the central portion of the active layer 20 deviated from the central portion of the ceramic body 110 upwardly. Here, in the case in which (B+C)/A was smaller than 1, it can be appreciated that the central portion of the active layer 220 deviated from the central portion of the ceramic body 110 downwardly.

Referring to the above Table 1, it may be confirmed that in samples 9 to 30, inventive examples in which the ratio of the central portion of the active layer 20 deviating from the central portion of the ceramic body 110, (B+C)/A, satisfied 1.05≤(B+C)/A≤1.75, acoustic noise was remarkably reduced to be less than 20 dB.

In addition, Samples 1 to 8 in which the ratio of the central portion of the active layer 20 deviating from the central portion of the ceramic body 110, that is, (B+C)/A, was less than 1.05, the central portion of the active layer 20 rarely deviated from the central portion of the ceramic body 110 or the central portion of the active layer 20 deviated from the central portion of the ceramic body 110 downwardly.

In Samples 1 to 8 in which (B+C)/A was less than 1.05, acoustic noise was 23.1 to 30.9 dB. Therefore, it could be appreciated that an acoustic noise decreasing effect is lower in Samples 1 to 8 as compared to the case of Inventive Examples.

In addition, in Samples 29 and 30 in which the ratio of the central portion of the active layer 20 deviating from the central portion of the ceramic body 110, that is, (B+C)/A, exceeded 1.75, capacitance was excessively lowered as compared with a target capacitance, such that a capacitance defect was generated.

In Table 1 above, in the case in which a capacitance implementation rate (that is, a ratio of actual capacitance to target capacitance) is denoted by "NG", it means that an actual capacitance value was below 80% when a target capacitance value was 100%.

As set forth above, according to the exemplary embodiments of the present disclosure, a high capacitance multilayer ceramic capacitor in which internal electrodes may be horizontally mounted with respect to a mounting surface and a mounting density may be improved, and a board having the multilayer ceramic capacitor mounted thereon may be provided.

In addition, according to the exemplary embodiments of the present disclosure, a multilayer ceramic capacitor in which acoustic noise is significantly decreased, and a board having the multilayer ceramic capacitor mounted thereon may be provided.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body including dielectric layers and having first and second main surfaces facing each other in a thickness direction, first and second end surfaces facing each other in a length direction, and first and second side surfaces facing each other in a width direction;
an active layer disposed in the ceramic body and including first internal electrodes each having a first lead part exposed to at least one of the first and second side surfaces, and second internal electrodes opposed to the first internal electrodes, with the dielectric layers interposed therebetween, and each having a second lead part exposed to the at least one of the first and second side surfaces, thereby forming capacitance;
an upper cover layer formed on an upper portion of the active layer in the thickness direction;
a lower cover layer formed on a lower portion of the active layer in the thickness direction and having a thickness greater than that of the upper cover layer;
a first external electrode connected to the first internal electrodes and extended from the side to which the first lead part is exposed to at least one of the first and second main surfaces;
a second external electrode connected to the second internal electrodes and extended from the side to which the second lead part is exposed to at least one of the first and second main surfaces; and
insulating layers covering the first and second external electrodes formed on the first and second side surfaces.

2. The multilayer ceramic capacitor of claim 1, wherein regions of the first and second lead parts exposed to the at least one of the first and second side surfaces are overlapped with each other.

3. The multilayer ceramic capacitor of claim 1, wherein regions of the first and second lead parts exposed to the at least one of the first and second side surfaces are not overlapped with each other.

4. The multilayer ceramic capacitor of claim 1, wherein regions of the first and second lead parts exposed to the at least one of the first and second side surfaces have widths smaller than those of the first and second external electrodes formed on the first and second side surfaces.

5. The multilayer ceramic capacitor of claim 1, wherein the first and second lead parts are exposed to the first side surface of the ceramic body.

6. The multilayer ceramic capacitor of claim 1, wherein the first and second lead parts are exposed to the first and second side surfaces of the ceramic body, respectively.

7. The multilayer ceramic capacitor of claim 1, wherein the first lead part is exposed to the first side surface, and the second lead part is exposed to the second side surface.

8. The multilayer ceramic capacitor of claim 1, wherein the first and second external electrodes are extended from the first side surface to the at least one of the first and second main surfaces.

9. The multilayer ceramic capacitor of claim 1, wherein the first and second external electrodes are extended from the first side surface to the first and second main surfaces.

10. The multilayer ceramic capacitor of claim 1, wherein the first and second external electrodes are extended from the first side surface to one of the first and second main surfaces, and the second side surface.

11. The multilayer ceramic capacitor of claim 1, wherein the first and second external electrodes are extended from the first side surface to the first and second main surfaces and the second side surface.

12. The multilayer ceramic capacitor of claim 1, wherein the first and second external electrodes are spaced apart from the first and second end surfaces by a predetermined interval.

13. The multilayer ceramic capacitor of claim 1, wherein the first external electrode is extended from the first side surface to the first main surface, and the second external electrode is extended from the second side surface to the first main surface.

14. The multilayer ceramic capacitor of claim 1, wherein the insulating layers cover the first and second external electrodes formed on the first and second side surfaces and the first and second side surfaces of the ceramic body.

15. The multilayer ceramic capacitor of claim 1, wherein the insulating layers cover the first and second external electrodes formed on the first and second side surfaces and the first and second side surfaces and the first and second end surfaces of the ceramic body.

16. The multilayer ceramic capacitor of claim 1, wherein the insulating layers cover regions of the first and second external electrodes formed on the first and second side surfaces, from a mounting surface to a predetermined height.

17. The multilayer ceramic capacitor of claim 1, wherein the insulating layers are spaced apart from a mounting surface of the ceramic body by a predetermined interval.

18. The multilayer ceramic capacitor of claim 1, wherein the insulating layers are formed of an organic resin, a ceramic, an inorganic filler, a glass, or a mixture thereof.

19. The multilayer ceramic capacitor of claim 1, wherein the upper or lower cover layer includes an identifying part for identifying upper and lower portions of the ceramic body.

20. The multilayer ceramic capacitor of claim 19, wherein the identifying part includes a dielectric layer in which at least one metal selected from a group consisting of nickel (Ni), manganese (Mn), chromium (Cr), and Vanadium (V) is added.

21. The multilayer ceramic capacitor of claim 19, wherein the identifying part is a mark generated by laser marking.

22. The multilayer ceramic capacitor of claim 1, wherein the first and second internal electrodes are disposed horizontally with respect to a mounting surface of the ceramic body.

23. The multilayer ceramic capacitor of claim 1, wherein when an average thickness of the dielectric layers is defined as td, $0.1\ \mu m \leq td \leq 2.0\ \mu m$ is satisfied.

24. The multilayer ceramic capacitor of claim 1, wherein thicknesses of the first and second internal electrodes are 1.5 μm or less.

25. A board having a multilayer ceramic capacitor mounted thereon comprising:
a printed circuit board having first and second electrode pads disposed thereon; and
a multi layer ceramic capacitor mounted on the printed circuit board,
wherein the multilayer ceramic capacitor includes: a ceramic body including dielectric layers and having first and second main surfaces facing each other in a thickness direction, first and second end surfaces facing each other in a length direction, and first and second side surfaces facing each other in a width direction; an active layer disposed in the ceramic body and including first internal electrodes each having a first lead part exposed to at least one of the first and second side surfaces and second internal electrodes opposed to the first internal electrodes, with the dielectric layers interposed therebetween, and each having a second lead part exposed to the at least one of the first and second side surfaces, thereby forming capacitance; an upper cover layer formed on an upper portion of the active layer in the thickness direction; a lower cover layer formed on a lower portion of the active layer in the thickness direction and having a thickness greater than that of the upper cover layer; a first external electrode connected to the first internal electrodes and extended from the side to which the first lead part is exposed to at least one of the first and second main surfaces; a second external electrode connected to the second internal electrodes and extended from the side to which the second lead part is exposed to the at least one of the first and second main surfaces; and insulating layers covering the first and second external electrodes formed on the first and second side surfaces.

26. The multilayer ceramic capacitor of claim 1, wherein a half of the overall thickness of the ceramic body is defined as A, a thickness of the lower cover layer is defined as B, and a half of the overall thickness of the active layer is defined as C, and (B+C)/A is in the range of 1.05 to 1.75.

27. The multilayer ceramic capacitor of claim 1, wherein a thickness of the lower cover layer is defined as B, and a thickness of the upper cover layer is defined as D, and D/B is in the range of 0.02 to 0.42.

\* \* \* \* \*